US 12,185,585 B2

(12) United States Patent
Thielemans et al.

(10) Patent No.: US 12,185,585 B2
(45) Date of Patent: Dec. 31, 2024

(54) ACTIVE MATRIX DISPLAY, SYSTEM, AND METHOD HAVING AN ADDITIONAL TRANSISTOR THAT DISCHARGES A STORAGE CAPACITOR WITHIN PIXEL CIRCUITS, AT LEAST ONE PIXEL CIRCUIT DRIVEN BY A DRIVE CIRCUIT RESIDES PHYSICAL WITHIN ANOTHER DRIVE CIRCUIT, AND/OR OFF-TO-ON TIME OF SCAN SIGNALS ARE SET IN RELATION TO AN OPERATION OF A CAMERA RECORDING THE DISPLAY

(71) Applicant: Stereyo BV, Nazareth (BE)

(72) Inventors: Robbie Thielemans, Nazareth (BE); Vince Dundee, Glendale, CA (US)

(73) Assignee: STEREYO BV, Nazareth (BE)

( * ) Notice: Subject to any disclaimer, the term of this patent is extended or adjusted under 35 U.S.C. 154(b) by 0 days.

(21) Appl. No.: 18/233,115

(22) Filed: Aug. 11, 2023

(65) Prior Publication Data
US 2024/0206227 A1 Jun. 20, 2024

Related U.S. Application Data

(60) Provisional application No. 63/433,646, filed on Dec. 19, 2022.

(51) Int. Cl.
*H10K 59/121* (2023.01)
*G09G 3/3266* (2016.01)
(Continued)

(52) U.S. Cl.
CPC ....... *H10K 59/1213* (2023.02); *G09G 3/3266* (2013.01); *G09G 3/3275* (2013.01);
(Continued)

(58) Field of Classification Search
CPC ............. H10K 59/1213; H10K 59/131; H10K 59/1216; G09G 3/3266; G09G 3/3275; G09G 2360/10
See application file for complete search history.

(56) References Cited

U.S. PATENT DOCUMENTS 5,767,818 A 6/1998 Nishida
6,055,071 A 4/2000 Kuwata et al.
(Continued)

FOREIGN PATENT DOCUMENTS

BE 20195196 3/2019
BE 20195142 7/2019
(Continued)

OTHER PUBLICATIONS

Belgian Search Report from Belgian Patent Application No. BE202305595, Nov. 21, 2023.
(Continued)

*Primary Examiner* — Lex H Malsawma
(74) *Attorney, Agent, or Firm* — Workman Nydegger

(57) ABSTRACT

An active matrix display is disclosed that includes a plurality of pixel circuits. Each of the pixel circuits includes a light-emitting element, at least two transistors, and a storage capacitor. An additional transistor is provided, which is configured for discharging of the storage capacitor. An active matrix display is also disclosed, having at least two drive circuits, wherein at least one of the pixel circuits is driven by a data driver of a first drive circuit is residing physically within a second drive circuit, or vice versa. Further, an active matrix is disclosed, wherein the timing of scan signals and updating of data signals is programmed in relation to the operation of a camera recording an image that is displayed on the active matrix display.

26 Claims, 12 Drawing Sheets

(51) Int. Cl.
*G09G 3/3275* (2016.01)
*H10K 59/131* (2023.01)

(52) U.S. Cl.
CPC ....... *H10K 59/1216* (2023.02); *H10K 59/131* (2023.02); *G09G 2360/10* (2013.01)

(56) References Cited

U.S. PATENT DOCUMENTS

| | | |
|---|---|---|
| 6,483,555 B1 | 11/2002 | Thielemans et al. |
| 6,717,625 B1 | 4/2004 | Thielemans |
| 7,015,902 B2 | 3/2006 | Nagai et al. |
| 7,019,721 B2 | 3/2006 | Thielemans et al. |
| 7,071,620 B2 | 7/2006 | Devos et al. |
| 7,071,894 B1 | 7/2006 | Thielemans et al. |
| 7,079,092 B2 | 7/2006 | Tanghe et al. |
| 7,102,601 B2 | 9/2006 | Devos et al. |
| 7,157,838 B2 | 1/2007 | Thielemans et al. |
| 7,176,861 B2 | 2/2007 | Dedene et al. |
| 7,205,729 B2 | 4/2007 | Thielemans et al. |
| 7,227,519 B1 | 6/2007 | Kawase et al. |
| 7,262,753 B2 | 8/2007 | Tanghe et al. |
| 7,301,273 B2 | 11/2007 | Dedene et al. |
| 7,365,720 B2 | 4/2008 | Bouwens et al. |
| 7,443,466 B2 | 10/2008 | Dedene et al. |
| 7,777,691 B1 | 8/2010 | Nimmer et al. |
| D730,309 S | 5/2015 | Hochman et al. |
| 9,069,519 B1 | 6/2015 | Hall |
| D751,998 S | 3/2016 | Hochman et al. |
| 9,380,720 B2 | 6/2016 | Thielemans et al. |
| 9,477,438 B1 | 10/2016 | Hochman et al. |
| D771,844 S | 11/2016 | Hochman et al. |
| 9,524,666 B2 | 12/2016 | Hochman et al. |
| 9,660,403 B2 | 5/2017 | Hochman et al. |
| 10,325,541 B2 | 6/2019 | Hochman et al. |
| 10,333,109 B2 | 6/2019 | Hochman et al. |
| 10,892,297 B2 | 1/2021 | Chae et al. |
| 10,917,679 B2 | 2/2021 | Dunning et al. |
| 11,310,436 B2 | 4/2022 | Hochman et al. |
| 11,328,655 B2 | 5/2022 | Sugiyama et al. |
| 11,445,123 B2 | 9/2022 | Deighton |
| 11,496,726 B2 | 11/2022 | Deighton |
| 11,552,061 B2 | 1/2023 | Chae et al. |
| 11,610,543 B2 | 3/2023 | Thielemans et al. |
| 11,695,907 B2 | 7/2023 | Steudel et al. |
| 11,881,151 B2 | 1/2024 | Thielemans et al. |
| 11,924,560 B2 | 3/2024 | Thielemans et al. |
| 11,948,501 B2 | 4/2024 | Thielemans et al. |
| 11,948,506 B2 | 4/2024 | Thielemans et al. |
| 2002/0163513 A1 | 11/2002 | Tsuji |
| 2003/0095138 A1 | 5/2003 | Kim et al. |
| 2003/0128299 A1 | 7/2003 | Coleman et al. |
| 2003/0133619 A1 | 7/2003 | Wong et al. |
| 2004/0113875 A1 | 6/2004 | Miller et al. |
| 2004/0207315 A1 | 10/2004 | Thielemans et al. |
| 2004/0212582 A1 | 10/2004 | Thielemans et al. |
| 2004/0233125 A1 | 11/2004 | Tanghe et al. |
| 2004/0233148 A1 | 11/2004 | Tanghe et al. |
| 2005/0017922 A1 | 1/2005 | Devos et al. |
| 2005/0052375 A1 | 3/2005 | Devos et al. |
| 2005/0116667 A1 | 6/2005 | Mueller et al. |
| 2005/0122406 A1 | 6/2005 | Voss et al. |
| 2005/0128751 A1 | 6/2005 | Roberge et al. |
| 2005/0133761 A1 | 6/2005 | Thielemans |
| 2005/0134525 A1 | 6/2005 | Tanghe et al. |
| 2005/0134526 A1 | 6/2005 | Willem et al. |
| 2005/0213128 A1 | 9/2005 | Imai et al. |
| 2006/0022914 A1 | 2/2006 | Kimura et al. |
| 2006/0139238 A1 | 6/2006 | Chiba et al. |
| 2006/0290614 A1* | 12/2006 | Nathan ............... G09G 3/3233 345/76 |
| 2007/0035484 A1 | 2/2007 | Chang |
| 2007/0081357 A1 | 4/2007 | Kim et al. |
| 2007/0241988 A1 | 10/2007 | Zerphy et al. |
| 2007/0253008 A1 | 11/2007 | Edge et al. |
| 2007/0263394 A1 | 11/2007 | Thielemans et al. |
| 2008/0046217 A1 | 2/2008 | Polonskiy et al. |
| 2008/0079816 A1 | 4/2008 | Yen et al. |
| 2008/0111773 A1 | 5/2008 | Tsuge |
| 2008/0165081 A1 | 7/2008 | Lawther et al. |
| 2008/0285981 A1 | 11/2008 | Diab et al. |
| 2009/0009103 A1 | 1/2009 | McKechnie et al. |
| 2009/0066631 A1 | 3/2009 | Lianza |
| 2009/0102957 A1 | 4/2009 | Phelan |
| 2009/0103200 A1 | 4/2009 | Feklistov et al. |
| 2009/0295706 A1 | 12/2009 | Feng |
| 2010/0001648 A1 | 1/2010 | De Clercq et al. |
| 2010/0103200 A1 | 4/2010 | Langendijk |
| 2010/0243025 A1 | 9/2010 | Bhatia et al. |
| 2010/0289783 A1 | 11/2010 | Leppla |
| 2010/0302284 A1 | 12/2010 | Karaki |
| 2010/0309218 A1 | 12/2010 | Suen et al. |
| 2011/0103013 A1 | 5/2011 | Furukawa |
| 2011/0121761 A1 | 5/2011 | Zhao |
| 2011/0176029 A1 | 7/2011 | Boydston et al. |
| 2012/0019633 A1 | 1/2012 | Holley |
| 2012/0033876 A1 | 2/2012 | Momeyer et al. |
| 2012/0062622 A1 | 3/2012 | Koyama et al. |
| 2012/0133837 A1 | 5/2012 | Furukawa |
| 2012/0287289 A1 | 11/2012 | Steinberg et al. |
| 2012/0307243 A1 | 12/2012 | Elliott |
| 2012/0313979 A1 | 12/2012 | Matsuura |
| 2012/0327108 A1 | 12/2012 | Kato et al. |
| 2013/0162696 A1 | 6/2013 | Matsumoto |
| 2013/0181884 A1 | 7/2013 | Perkins et al. |
| 2013/0226495 A1 | 8/2013 | Marcu et al. |
| 2013/0249377 A1 | 9/2013 | Hamer et al. |
| 2013/0272023 A1 | 10/2013 | Lai |
| 2013/0286000 A1 | 10/2013 | Han et al. |
| 2014/0002718 A1 | 1/2014 | Spielberg |
| 2014/0009485 A1 | 1/2014 | Asanuma |
| 2014/0009505 A1 | 1/2014 | Moon et al. |
| 2014/0049571 A1 | 2/2014 | Erinjippurath et al. |
| 2014/0049983 A1* | 2/2014 | Nichol ................ G02B 6/0018 362/610 |
| 2014/0125818 A1 | 5/2014 | Friend |
| 2015/0070402 A1 | 3/2015 | Shah et al. |
| 2015/0186097 A1 | 7/2015 | Hall |
| 2015/0229919 A1 | 8/2015 | Weber et al. |
| 2015/0339977 A1 | 11/2015 | Nathan et al. |
| 2015/0348479 A1 | 12/2015 | Kim et al. |
| 2015/0371405 A1 | 12/2015 | Zhao |
| 2016/0078802 A1 | 3/2016 | Liang et al. |
| 2016/0124091 A1 | 5/2016 | Kawahito et al. |
| 2016/0182790 A1 | 6/2016 | Horesh |
| 2016/0275835 A1 | 9/2016 | Yuan et al. |
| 2016/0335958 A1 | 11/2016 | Huang et al. |
| 2017/0032715 A1 | 2/2017 | Sutherland et al. |
| 2017/0032742 A1 | 2/2017 | Piper et al. |
| 2017/0061924 A1 | 3/2017 | Lee et al. |
| 2017/0069871 A1 | 3/2017 | Yim et al. |
| 2017/0171492 A1 | 6/2017 | Naito |
| 2017/0284630 A1 | 10/2017 | Sergenese et al. |
| 2017/0318178 A1 | 11/2017 | Debevec et al. |
| 2018/0018793 A1 | 1/2018 | Min et al. |
| 2018/0060014 A1 | 3/2018 | Son et al. |
| 2018/0090102 A1 | 3/2018 | Chappalli et al. |
| 2018/0091860 A1 | 3/2018 | Stokking et al. |
| 2018/0131160 A1 | 5/2018 | Zhang et al. |
| 2018/0235052 A1 | 8/2018 | Tada |
| 2018/0240409 A1 | 8/2018 | Li et al. |
| 2018/0342224 A1 | 11/2018 | Beon et al. |
| 2019/0064923 A1 | 2/2019 | Taniguchi |
| 2019/0080656 A1 | 3/2019 | Herranz et al. |
| 2019/0098293 A1 | 3/2019 | Lee et al. |
| 2019/0132560 A1 | 5/2019 | Grosse et al. |
| 2019/0172404 A1 | 6/2019 | Zhu |
| 2019/0209858 A1 | 7/2019 | Slaughter et al. |
| 2019/0212719 A1 | 7/2019 | Ono |
| 2019/0213951 A1 | 7/2019 | Li et al. |
| 2019/0244561 A1 | 8/2019 | Zong et al. |
| 2019/0295457 A1 | 9/2019 | Li et al. |
| 2019/0306477 A1 | 10/2019 | Nordback |
| 2019/0356940 A1 | 11/2019 | Mallett |
| 2019/0364309 A1 | 11/2019 | Von Braun et al. |

(56) References Cited

U.S. PATENT DOCUMENTS

| | | |
|---|---|---|
| 2019/0377535 A1 | 12/2019 | Rycyna et al. |
| 2020/0014904 A1 | 1/2020 | Wetzstein et al. |
| 2020/0027386 A1 | 1/2020 | Wang et al. |
| 2020/0037011 A1 | 1/2020 | Zong et al. |
| 2020/0043201 A1 | 2/2020 | Tanaka et al. |
| 2020/0098333 A1 | 3/2020 | Marcu |
| 2020/0126501 A1 | 4/2020 | Yamazaki et al. |
| 2020/0160791 A1 | 5/2020 | Chung |
| 2020/0225903 A1 | 7/2020 | Cohen |
| 2020/0280761 A1 | 9/2020 | Staples |
| 2020/0286424 A1 | 9/2020 | Thielemans et al. |
| 2020/0388210 A1 | 12/2020 | Thielemans et al. |
| 2020/0403117 A1 | 12/2020 | Fabien et al. |
| 2021/0005161 A1 | 1/2021 | Lee |
| 2021/0014385 A1 | 1/2021 | Boggavarapu et al. |
| 2021/0056937 A1 | 2/2021 | Sakai |
| 2021/0124174 A1 | 4/2021 | Tokunaga et al. |
| 2021/0125545 A1 | 4/2021 | Sohn et al. |
| 2021/0125570 A1 | 4/2021 | Kang et al. |
| 2021/0185778 A1 | 6/2021 | Otten |
| 2021/0201769 A1 | 7/2021 | Morris et al. |
| 2021/0217157 A1 | 7/2021 | Han et al. |
| 2021/0225267 A1 | 7/2021 | Thielemans et al. |
| 2021/0227270 A1 | 7/2021 | Braun |
| 2021/0266624 A1 | 8/2021 | Zong et al. |
| 2021/0295766 A1 | 9/2021 | Sugiyama et al. |
| 2021/0297717 A1 | 9/2021 | Braun |
| 2021/0306394 A1 | 9/2021 | Zong et al. |
| 2021/0321032 A1 | 10/2021 | Braun |
| 2021/0345058 A1 | 11/2021 | Itakura et al. |
| 2021/0366411 A1 | 11/2021 | Yang et al. |
| 2021/0383842 A1 | 12/2021 | Han et al. |
| 2021/0397398 A1 | 12/2021 | Han et al. |
| 2022/0014728 A1 | 1/2022 | Deighton |
| 2022/0020727 A1 | 1/2022 | Noh et al. |
| 2022/0059045 A1 | 2/2022 | Kobayashi et al. |
| 2022/0059607 A1 | 2/2022 | Murugan et al. |
| 2022/0060612 A1* | 2/2022 | Hochman ............ H04N 5/06 |
| 2022/0076615 A1 | 3/2022 | Ding et al. |
| 2022/0103738 A1 | 3/2022 | Deighton |
| 2022/0150456 A1 | 5/2022 | Steudel et al. |
| 2022/0191109 A1 | 6/2022 | Chen et al. |
| 2022/0246670 A1 | 8/2022 | Chen et al. |
| 2022/0254317 A1 | 8/2022 | Hochman et al. |
| 2022/0350562 A1 | 11/2022 | Wang et al. |
| 2022/0375387 A1 | 11/2022 | Deighton |
| 2022/0375403 A1 | 11/2022 | Cheng et al. |
| 2022/0413790 A1 | 12/2022 | Cai et al. |
| 2023/0013582 A1 | 1/2023 | Wang et al. |
| 2023/0154399 A1 | 5/2023 | Thielemans et al. |
| 2023/0162400 A1 | 5/2023 | Liu et al. |
| 2023/0162662 A1 | 5/2023 | Zhang et al. |
| 2023/0163142 A1 | 5/2023 | Lu et al. |
| 2023/0186821 A1 | 6/2023 | Hashempour et al. |
| 2023/0209207 A1 | 6/2023 | Hochman et al. |
| 2023/0274693 A1 | 8/2023 | Thielemans et al. |
| 2023/0282153 A1 | 9/2023 | Thielemans et al. |
| 2023/0298503 A1 | 9/2023 | Zhang et al. |
| 2023/0326175 A1 | 10/2023 | Zhang et al. |
| 2024/0022686 A1 | 1/2024 | Thielemans et al. |
| 2024/0044465 A1 | 2/2024 | Thielemans et al. |

FOREIGN PATENT DOCUMENTS

| | | |
|---|---|---|
| BE | 1026226 A1 | 11/2019 |
| CN | 102290003 A | 12/2011 |
| CN | 206741357 U | 12/2017 |
| CN | 207352560 U | 5/2018 |
| CN | 110602875 A | 12/2019 |
| CN | 110617000 A | 12/2019 |
| DE | 102006054856 A1 | 1/2009 |
| EP | 1172783 A1 | 1/2002 |
| EP | 1780798 A1 | 5/2007 |
| EP | 2323072 A1 | 5/2011 |
| EP | 3099058 A1 | 11/2016 |
| EP | 3139422 A2 | 3/2017 |
| GB | 2469819 A | 11/2010 |
| JP | 2007062892 A | 3/2007 |
| JP | 2019214445 A | 12/2019 |
| KR | 20170065163 A | 6/2017 |
| TW | 200608327 A | 3/2006 |
| TW | 200608328 A | 3/2006 |
| WO | 2013186278 A1 | 12/2013 |
| WO | 2015114720 A1 | 8/2015 |
| WO | 2018164105 A1 | 9/2018 |
| WO | 2019215219 A1 | 11/2019 |
| WO | 2020253249 A1 | 12/2020 |
| WO | 2021009719 A1 | 1/2021 |
| WO | 2022013191 A1 | 1/2022 |
| WO | 2022064062 A1 | 3/2022 |
| WO | 2022087322 A1 | 4/2022 |

OTHER PUBLICATIONS

Response to Belgian Search Report from Belgian Patent Application No. BE2023/5595, filed Mar. 21, 2024.
Extended European Search Report from European Patent Application No. EP23185674.1, Nov. 16, 2023.
Partial European Search Report from European Patent Application No. EP23198096, Nov. 29, 2023.
Extended European Search Report from European Patent Application No. EP23198096.2, Apr. 9, 2024.
Extended European Search Report from European Patent Application No. EP23190432.7, Feb. 12, 2024.
Extended European Search Report from European Patent Application No. EP23160521, Jul. 6, 2023.
Response to Extended European Search Report from European Patent Application No. EP23160521, dated Jan. 29, 2024.
Extended European Search Report from European Patent Application No. EP23218322.8, Mar. 27, 2024.
Extended European Search Report from European Patent Application No. EP23218336.8, Apr. 10, 2024.
Partial European Search Report from European Patent Application No. EP23218348.3, Apr. 30, 2024.
Extended European Search Report from European Patent Application No. EP23218353.3, Mar. 26, 2024.
Extended European Search Report from European Patent Application No. EP23218356.6, Apr. 5, 2024.
Extended European Search Report from European Patent Application No. EP23218377.2, Apr. 24, 2024.
Partial European Search Report from Corresponding European Patent Application No. EP23218348.3, Apr. 30, 2024.
Baker, Simon, "Pulse Width Modulation (PWM)", Mar. 17, 2015, 13 pages, TFT Central.
Burr, David, "Motion Perception: Human Psychophysics", Apr. 18, 2013, pp. 763-776, MIT Press.
Cast, Inc., "Understanding—and Reducing—Latency in Video Compression Systems", Oct. 25, 2013, 7 pages, retrieved from <https://web.archive.org/web/20131025202911/https://www.design-reuse.com/articles/33005/understanding-latency-in-video-compression-systems.html>.
Davis et al., "Humans perceive flicker artifacts at 500 Hz", Feb. 3, 2015, 4 pages, Nature, Scientific Reports.
Kang et al., "Nanoimprinted Semitransparent Metal Electrodes and Their Application in Organic Light-Emitting Diodes," May 21, 2007, 6 pages, Advanced Materials.
Larson, Jennifer, "How Many Frames Per Second Can the Human Eye See?", Oct. 20, 2020, 12 pages, retrieved from <https://www.healthline.com/health/human-eye-fps>.
Lee et al., "Solution-Processed Metal Nanowire Mesh Transparent Electrodes", Jan. 12, 2008, pp. 689-692, Nano Letters, vol. 8, No. 2.
Mackin et al., "High Frame Rates and the Visibility of Motion Artifacts", Jun. 30, 2017, 19 pages, SMPTE Motion Imaging Journal, vol. 126, Issue 5.
Thielemans, Robbie, "Displays Applications of LEDs", Handbook of Visual Display Technology, May 21, 2011, 14 pages.

(56) References Cited

OTHER PUBLICATIONS

Thielemans, Robbie, "LED Display Applications and Design Considerations", Handbook of Visual Display Technology, May 21, 2011, 5 pages, retrieved from https://link.springer.com/referenceworkentry/10.1007/978-3-540-79567-4_76.

Tobii Connect, "The speed of human visual perception", Sep. 14, 2022, 1 page, retrieved from <https://connect.tobii.com/s/article/the-speed-of-human-perception?language=en_US>.

Wikipedia, "MAC Address", 10 pages, retrieved from <https://en.wikipedia.org/wiki/MAC_address>.

Wilson, Derek, "Exploring Input Lag Inside Out", Jul. 16, 2019, 2 pages, retrieved from <https://www.anandtech.com/show/2803>.

Zhang, Yin, "Performance Characteristics of Lithium Coin Cells for Use in Wireless Sensing Systems", Jun. 17, 2012, 143 pages, All Theses and Dissertations, Brigham Young University.

"The Ins and Outs of HDR—Gamma Curves", Jun. 8, 2020, 3 pages, retrieved from <https://www.eizoglobal.com/library/management/ins-and-outs-of-hdr/index2.html>.

Extended European Search Report from corresponding EP Application No. EP18198749.6, Nov. 12, 2018.

International Search Report and Written Opinion from PCT Application No. PCT/EP2019/061804, Jun. 13, 2019.

Applicant's Amendment/Remarks filed at the EPO on Feb. 20, 2020 for PCT/EP2019/061804.

Applicant's Amendment/Remarks filed at the EPO on May 26, 2020 for PCT/EP2019/061804.

International Preliminary Report on Patentability from PCT/EP2019/061804, Jul. 10, 2020.

Belgian Search Report from BE Application No. 201905196, Aug. 13, 2019.

Search Report for BE 2019/05759 mailed Jan. 23, 2020, 18 pages.

Belgian Search Report for Belgian Patent Application No. BE2019/5970, Jul. 24, 2020.

Response to Belgian Search Report for Belgian Patent Application No. BE2019/5970, filed by Applicant at the Belgian Patent Office on Nov. 24, 2020.

Belgian Search Report from corresponding Belgian Application No. BE 202205007, Jun. 7, 2022.

Extended European Search Report from corresponding EP Application No. 22185014.2, Dec. 8, 2022.

Office Action from European Application No. 19722133.6, Jan. 19, 2023.

European Search Report from Corresponding European Patent Application No. EP23218348.3, Sep. 13, 2024.

\* cited by examiner

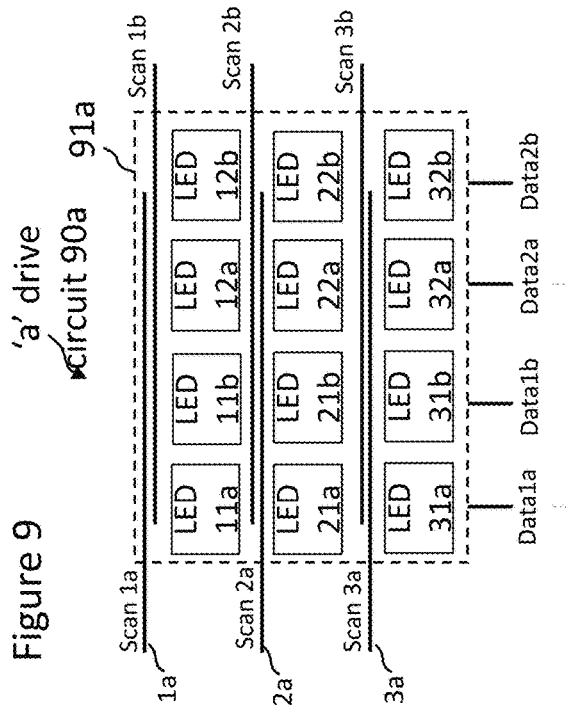
Figure 8
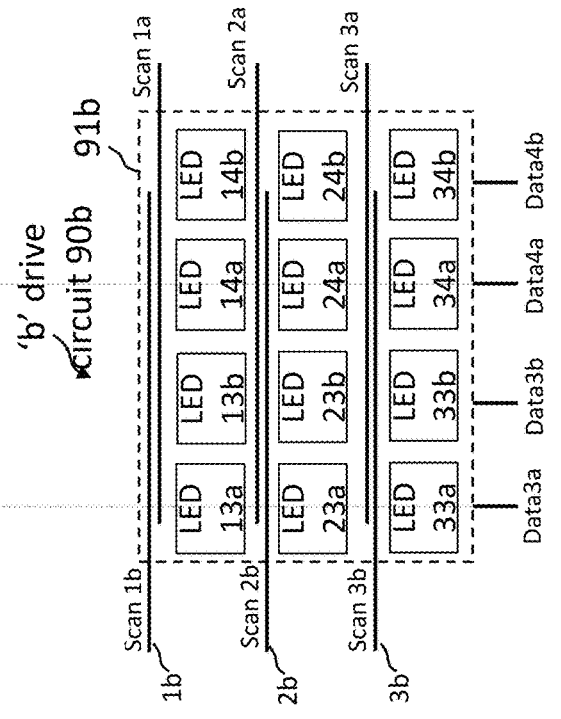
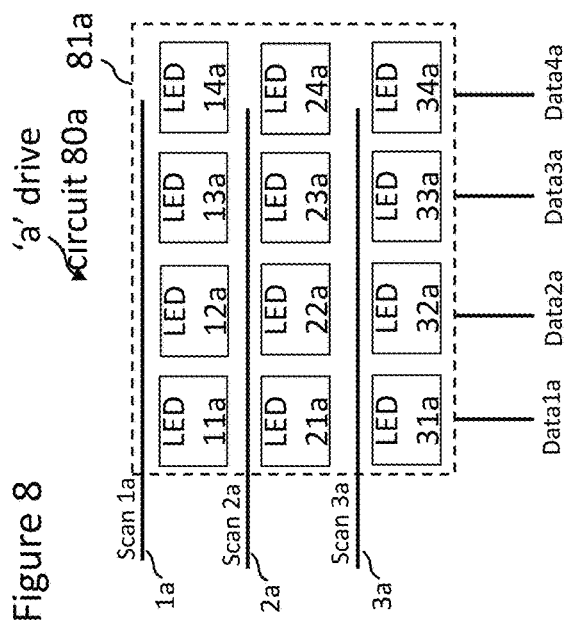
Figure 9
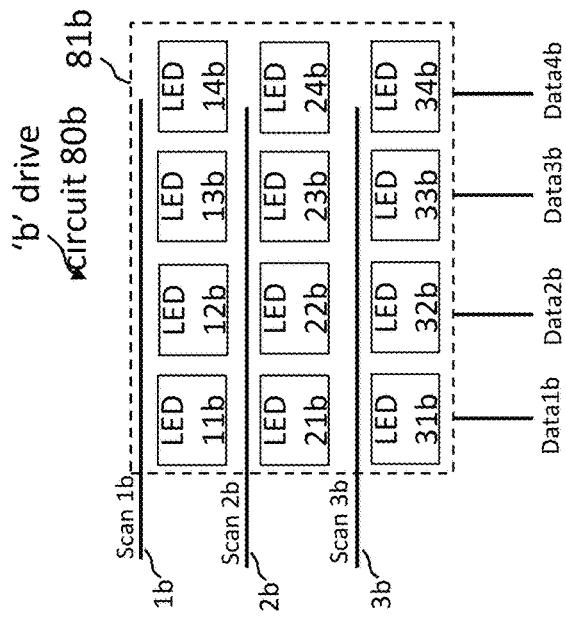

ACTIVE MATRIX DISPLAY, SYSTEM, AND METHOD HAVING AN ADDITIONAL TRANSISTOR THAT DISCHARGES A STORAGE CAPACITOR WITHIN PIXEL CIRCUITS, AT LEAST ONE PIXEL CIRCUIT DRIVEN BY A DRIVE CIRCUIT RESIDES PHYSICAL WITHIN ANOTHER DRIVE CIRCUIT, AND/OR OFF-TO-ON TIME OF SCAN SIGNALS ARE SET IN RELATION TO AN OPERATION OF A CAMERA RECORDING THE DISPLAY

CROSS-REFERENCE TO RELATED APPLICATIONS

This application claims the benefit of and priority to U.S. Provisional Patent Application Ser. No. 63/433,646 filed on Dec. 19, 2022, and entitled "Modular Display with Integrated on Camera Feature Sets," which is expressly incorporated herein by reference.

TECHNICAL FIELD

This disclosure relates to a light source display, in particular an active matrix (AM) display, comprising a plurality of pixel circuits, each comprising a light-emitting element (LEE) such as, for example, a light-emitting diode (LED), transistors and a storage capacitor. The pixel circuits are typically arranged in an array forming an AM LEE board, or in particular an AM LED board. The disclosure further relates to an active matrix display with a drive circuit configuration comprising at least two drive circuits, wherein at least one of the pixel circuits driven by data signals of a first drive circuit is residing physically within a second drive circuit, or vice versa. Herewith, improved visual performance of the display can be achieved, and/or the display can be enhanced for 3D application. The active matrix display having at least two drive circuits may comprise per drive circuit a scan signal set, wherein each of the scan signal sets having a programmable start and stop, and each of the scan signals sets may represent scan signals for a different video data stream. The disclosure also relates to an active matrix display wherein the timing of scan signals and updating of data signals are programmed in relation to the operation of a camera recording an image that is displayed on the active matrix display. In particular, the relation is made with the camera shutter time. The disclosure relates to an active matrix and corresponding pixel circuits, each pixel circuit having a plurality of transistors and a storage capacitor, wherein one of the transistors is intended for discharging purposes of the storage capacitor.

BACKGROUND

Active matrix (AM) displays are commonly used in all modern LCD and OLED computer, TV and mobile device screens. They have sharper images with more contrast than less expensive passive matrix screens. AM displays provide a more responsive image, and thus update the screen faster than passive matrix displays. Therefore, they do not suffer from the "submarining" effect, in which the cursor disappears when moved rapidly. Moreover, they are capable of being viewed at a wider range of viewing angles.

AM displays do have a crisp picture because each pixel has a transistor. Using current transistor technology, active matrix screens are again (as passive matrix ones) addressed one row at a time for each electronic frame. Since they use thin film transistors (TFTs) in the circuit, active matrix displays are also called TFT displays. In the pixel drive scheme of an active matrix display, the pixel (e.g. LED or OLED) is supposed to light up constantly in comparison to the passive matrix pixel drive scheme.

With their high-quality images, wide array of colors and fast response time, active matrix (AM) displays represent an improved technology compared to passive matrix (PM) technology. Although, active matrix displays are more expensive than their PM counterparts, they are very light (in weight) and often consume less power, such that AM displays are very much desirable in portable devices.

In case it is desired to turn off an image being displayed on an active matrix display, an individual scan of every pixel has to be performed to put its light output value to zero. This may be very time consuming, and hence a solution is sought for to quickly turn off the pixels and thus the image being displayed.

Existing displays, both using light emitting (e.g. LED or OLED) or reflective technologies (e.g. LCD) that are used for studio applications, meaning within, for example, a broadcasting environment, in general show defects on the final screen (resulting from camera recording) that is seen by the public or user. For example, when watching the news on TV, behind the speaker or journalist is a (LED) screen mounted with video or image displayed thereon, it is common that the screen in the back shows the video or image with banding effects. Eliminating such banding effects has been earlier discussed by the same Applicant in U.S. patent application Ser. No. 16/895,872, filed at the USPTO on Jun. 8, 2020 (which is referred to herein as the "Studio display" application), the contents of which are incorporated herein by reference, and U.S. patent application Ser. No. 17/865,096 (which is referred to herein as the "Studio2" application), filed at the USPTO on Jul. 14, 2022, which claims the benefit of priority to U.S. Provisional Patent Application 63/221,822, which was filed at the USPTO on Jul. 14, 2021, the contents of each of which are incorporated herein by reference. Although not explicitly mentioned, the displays herewith referred to are passive matrix displays. A solution to reduce banding effects when using in particular active matrix displays has not been delivered, nor discussed yet.

SUMMARY OF THE INVENTION

In general, an object of this disclosure is to provide a solution for quickly turning off the pixels in an active matrix display. In addition, the aim of the invention is to reduce on-camera banding effects when recording images from an active matrix display.

In a first aspect of the invention, an active matrix display is provided comprising a plurality of pixel circuits, each of the plurality of pixel circuits comprising a light-emitting element, at least two transistors, and a storage capacitor, wherein one of the at least two transistors is intended for discharging purposes of the storage capacitor. According to an embodiment, each of the plurality of pixel circuits being connected to scan signal lines and data signal lines, providing scan signals and data signals respectively, is further connected to one or more (dedicated) discharge signal lines each providing a discharge signal.

In a second aspect of the invention, an active matrix display is provided comprising a plurality of pixel circuits, each of the plurality of pixel circuits comprising a light-emitting element, one or more transistors and a storage capacitor. Each of the plurality of pixel circuits has a first connection point and a second connection point, and is connected at the first connection point to first lines and at the second connection point to second lines. The active matrix display also comprises at least two drive circuits. Each of the drive circuits has electrical connections defined by rows and columns that electrically connect to the pixel circuits (each of the drive circuits being configured as a drive device). Each of the first lines is arranged to be connected to a data signal line (of a data driver), connected to one of the columns of the corresponding drive circuit, and providing a data signal for driving one of the columns of the corresponding drive circuit. Each of the second lines is arranged to be connected to a scan signal line (of a scanning unit), connected to one of the rows of the corresponding drive circuit, and providing a scan signal to one of the rows of the corresponding drive circuit. The at least two drive circuits include a first drive circuit and a second drive circuit. The at least one of the plurality of pixel circuits driven by the data signals (or data driver) of the first drive circuit is residing physically within the second drive circuit, or, at least one of the plurality of pixel circuits driven by the data signals (or data driver) of the second drive circuit is residing physically within the first drive circuit. According to an embodiment, the active matrix display displays an image that is defined by scan signals and data signals, and comprises, per drive circuit, a scan signal set, wherein each of the scan signal sets has a programmable start and stop.

In a third aspect of the invention, an active matrix display is provided displaying an image that is recorded by one or more cameras, each of the one or more cameras having a shutter and corresponding shutter opening time defined as the time when the shutter is open, and the image being displayed by the active matrix is defined by scan signals and data signals. The scan signals are on or off in function of time and the data signals are updated in time. The off-to-on time of the scan signals, defined as the time where the scan signal changes from off to on state, and update time of the data signals are programmed in relation to the operation of the one or more cameras, in particular in relation to their shutter time.

BRIEF DESCRIPTION OF THE DRAWINGS

FIG. 2(*b*) shows a physical layout of the LED display having such schematic multiplexing arrangement.

FIG. 3 corresponds operationally to the passive matrix multiplexing arrangement of FIGS. 2(*a*) and 2(*b*), being a simplified version thereof.

FIG. 8 shows a schematic of an active matrix LED display having two LED drive circuits.

FIG. 9 shows a schematic embodiment of an active matrix LED display having two LED drive circuits, wherein LEDs driven by a first set of data voltages of a first drive circuit are residing physically with a second drive circuit, and vice versa, in accordance with the invention.

DETAILED DESCRIPTION

Figure 1:
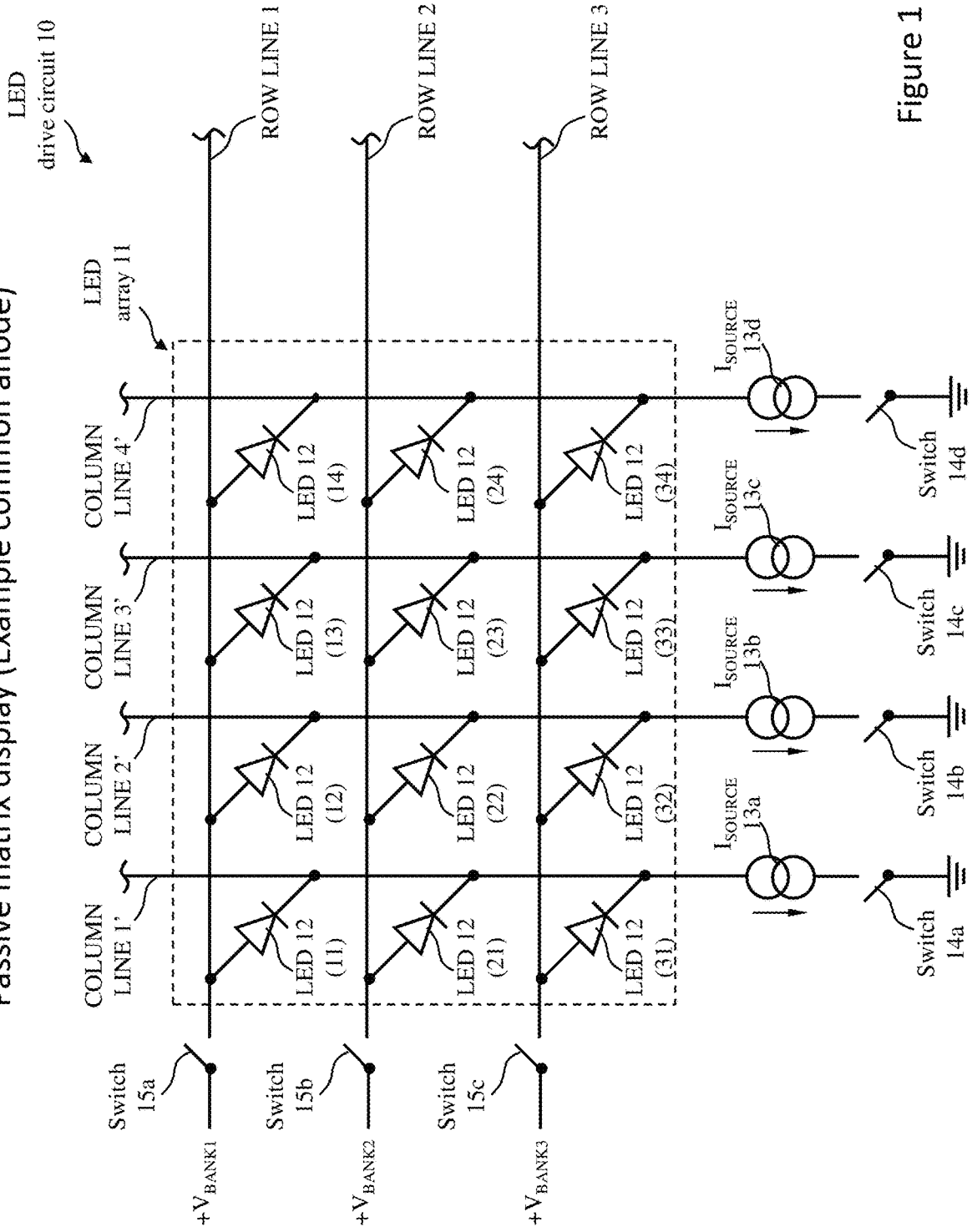
FIG. 1 shows a schematic diagram of a related passive matrix LED drive circuit, here in common anode configuration.

This patent application builds further on the same Applicant's earlier filed U.S. patent application Ser. No. 16/895, 872, filed at the USPTO on Jun. 8, 2020 (which is referred to herein as the "Studio display" application), the contents of which are incorporated herein by reference, and U.S. patent application Ser. No. 17/865,096 (which is referred to herein as the "Studio2" application), filed at the USPTO on Jul. 14, 2022, which claims the benefit of priority to U.S. Provisional Patent Application 63/221,822, which was filed at the USPTO on Jul. 14, 2021, the contents of each of which are incorporated herein by reference. But the present disclosure further focuses on the system and integration of the 'on camera feature sets'. Focus is made on a display system, modular in this case, as this is most complex to handle (as compared to non-modular). With modular display system is meant here that just one display can be considered, or a plurality of displays can be combined to appear together as one (large) screen or unity. Hence, the display system can be as small or as big as wanted, or as the particular application of the display system requires. Nevertheless, it can also be done on non-modular displays, for example, one single display to be used as such (e.g. standalone), not in combination with other displays. An object of this disclosure is to provide a method, implementation and chipset for on camera use of the display system (for instance in a studio environment) related to reducing on camera banding effect for active matrix displays.

Eliminating banding effects has been earlier discussed by the same Applicant in the beforementioned "Studio display" and "Studio2" patent applications (U.S. patent application Ser. No. 16/895,872 and U.S. patent application Ser. No.

17/865,096, respectively). As mentioned in these previous patent applications, "Studio display" and "Studio2" patent applications (U.S. patent application Ser. No. 16/895,872 and U.S. patent application Ser. No. 17/865,096, respectively) from the same Applicant, existing displays that are used for studio applications, meaning within, for example, a broadcasting environment, in general show defects on the final screen (resulting from camera recording) that is seen by the public or users. Complex and cumbersome manipulation is then often performed to make images acceptable again for the viewer, whereas only a mere acceptability is provided by lack of better availability. However, a robust and simple solution is yet described in the "Studio display" patent application (U.S. patent application Ser. No. 16/895,872) in relation to the sync-banding principle, i.e., Vertical Sync Update as described in therein. Synchronization can be provided by means of having a programmable update time of new entering images or the sync signal with which new images are scanned. The programmable aspect implies that it can be programmed such that certain amount of time is waited until images are viewed or represented. Moreover, in the "Studio2" patent application (U.S. patent application Ser. No. 17/865,096), one or more programmable off-set values can be selected to improve the interplay of a light source display with a camera recording the image displayed by the light source display, in order to improve energy efficiency and/or to reduce banding effects. One or more programmable off-set values represent a programmable off-set (of the light source display input signal or the image being displayed on the light source display) relative to the operation of the camera having a shutter and corresponding shutter time.

In a passive matrix display, pixels are addressed row by row, which is called time multiplexing. This means that all pixels on row 1 (or first row) are updated first, then all pixels on row 2 (or second row), etc. meaning that for a display with three rows, each row is only addressed ⅓ of the total time. FIG. 1 shows a picture embodiment of a related multiplexing schematic used for light-emitting diodes (LEDs) within a passive display matrix. It is noted that, instead of LEDs other types of light-emitting elements (LEEs) are also applicable. A LED drive circuit 10 for a LED display is represented, comprising multiple LEDs 12 arranged on a horizontal and vertical grid, i.e. in a LED array 11. Each of the LEDs 12 are indicated with their respective position in the LED array 11 (between brackets), e.g. on position 'first row, first column' the LED 12 is indicated with '11' between brackets. Within the LED drive circuit 10, the LEDs 12 are sharing a common anode in the same row or row line 1, 2, 3 via which they are driven by power supply Vbank1, Vbank2, Vbank3, and sharing a (constant current) driver 13a, 13b, 13c, 13d per column or column line 1', 2', 3', 4'. A positive voltage is electrically connected to each respective row 1, 2, 3 via a plurality of switches 15a, 15b, 15c. The LED drive circuit 10 comprises a plurality of drivers or current sources 13a, 13b, 13c, 13d, such as for example current source 13a which may be coupled to column 1' via a switch 14a. By analogy, other current source 13b, 13c, 13d may be coupled via respective switch 14b, 14c, 14d. Each LED 12 has an anode and a cathode. In general, the LED display comprises an electronical interface, and electronics to light up the individual LEDs 12, and is controlled by signals on the electronical interface. The electronical interface can be defined by a LED drive circuit 10 having electrical connections, here in FIG. 1 defined by rows 1, 2, 3 and columns 1', 2', 3', 4' that electrically connect to the LEDs 12 in the LED array 11. Related LEDs in display applications are generally driven using a passive matrix structure, herewith referring for example to the common anode principle (such as e.g. depicted here in FIG. 1), although common cathode is also possible. Applying multiplexing within the passive matrix LED display, will result in lots of connections. FIG. 1 illustrates the electrical connections for a 3 by 4 pixel display.

Figure 2:
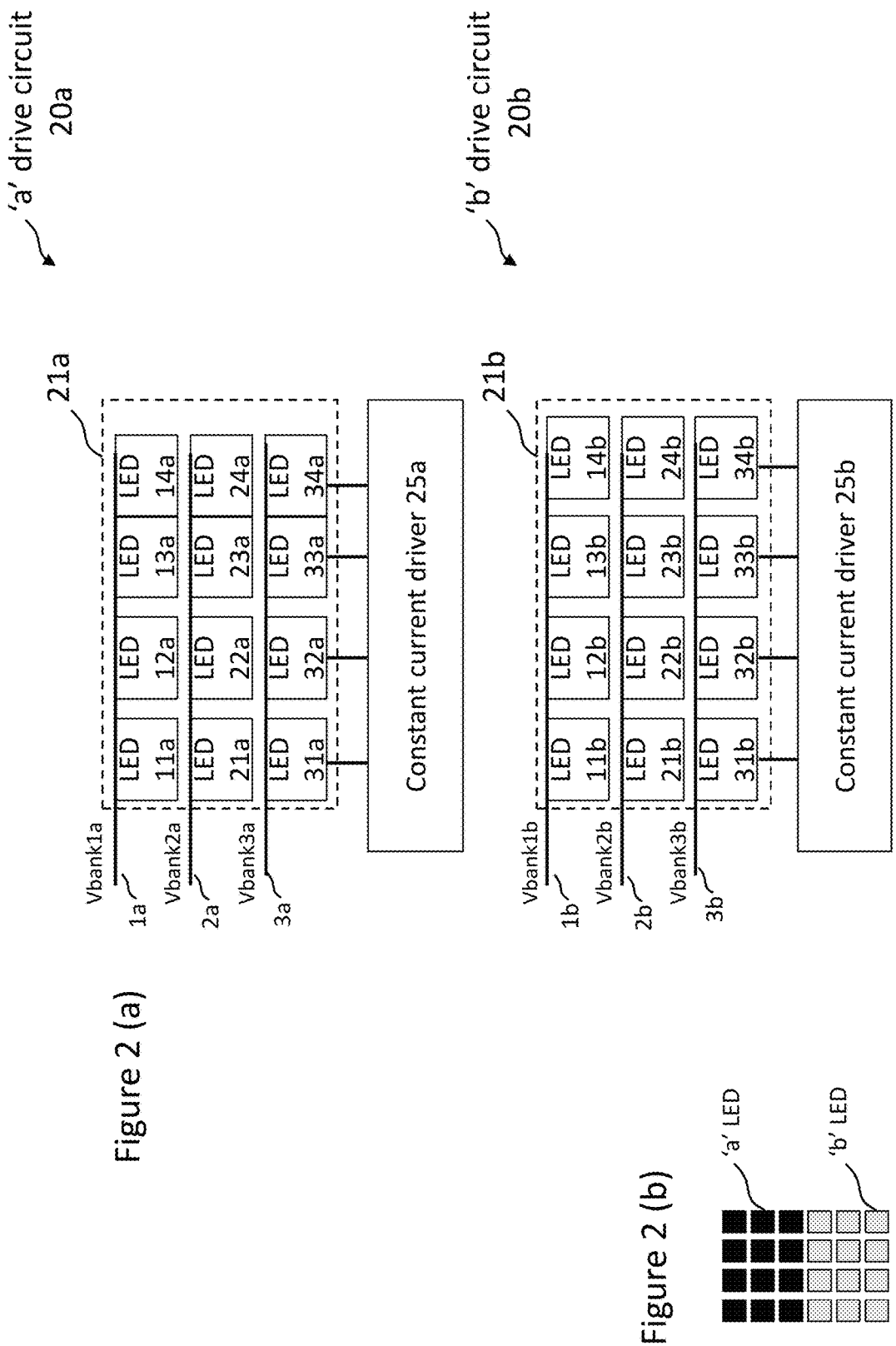
FIGS. 2 (*a*) and 2 (*b*) show a schematic passive matrix multiplexing arrangement of a LED display having two LED drive circuits, wherein the LEDs are arranged in a common anode configuration, wherein each of the LED drive circuit being configured as a common anode drive device.

In FIG. 2(a) (and FIG. 3) a related (multi) LED display is depicted with 24 LEDs, i.e. twice a 3×4 matrix of LEDs or twice an array of 12 LEDs arranged as 3×4. FIG. 2(a) shows a schematic multiplexing arrangement of a LED display having two LED drive circuits 20a, 20b (i.e. 'a' and 'b' circuit), wherein the LEDs are arranged in a common anode configuration, and wherein each of the LED drive circuits 20a, 20b being configured as a common anode drive device. Although, here again, common anode is shown by means of example, a common cathode configuration and common cathode drive device is not excluded, and can also be applied alternatively. For each drive circuit 20a, 20b, the LEDs are arranged in corresponding LED array 21a, 21b. Each of the LEDs are indicated with their respective position in one of the LED arrays 21a, 21b of either 'a' or 'b' circuit respectively. In this example, a first constant current driver 25a drives cathode side of all LEDs xxa (or 'a' LEDs) wherein the rows 1a, 2a, 3a are selected by Vbank1a, Vbank2a, Vbank3a power supply respectively (together Vbanka power supplies). Since all 'a' LEDs are part of the LED array 21a of the first drive circuit 20a, the first constant current driver 25a is (to be) connected to the 'a' drive circuit 20a. A second constant current driver 25b drives cathode side of the LEDs xxb (or 'b' LEDs) and the rows 1b, 2b, 3b are selected by Vbank1b, Vbank2b, Vbank3b power supply respectively (together Vbankb power supplies). While all 'b' LEDs are part of the LED array 21b of the second drive circuit 20b, the second constant current driver 25b is (to be) connected to the 'b' drive circuit 20b. In FIG. 2(b), an example of a physical layout is shown of the LED display (or LED board) having the schematic multiplexing arrangement of FIG. 2(a). For better visibility purposes, 'a' LEDs are represented in black, whereas 'b' LEDs are depicted in gray, herewith not implying that 'a' LEDs are black and/or 'b' LEDs are gray. They are only represented this way to easily distinguish them from one another.

Figure 3:
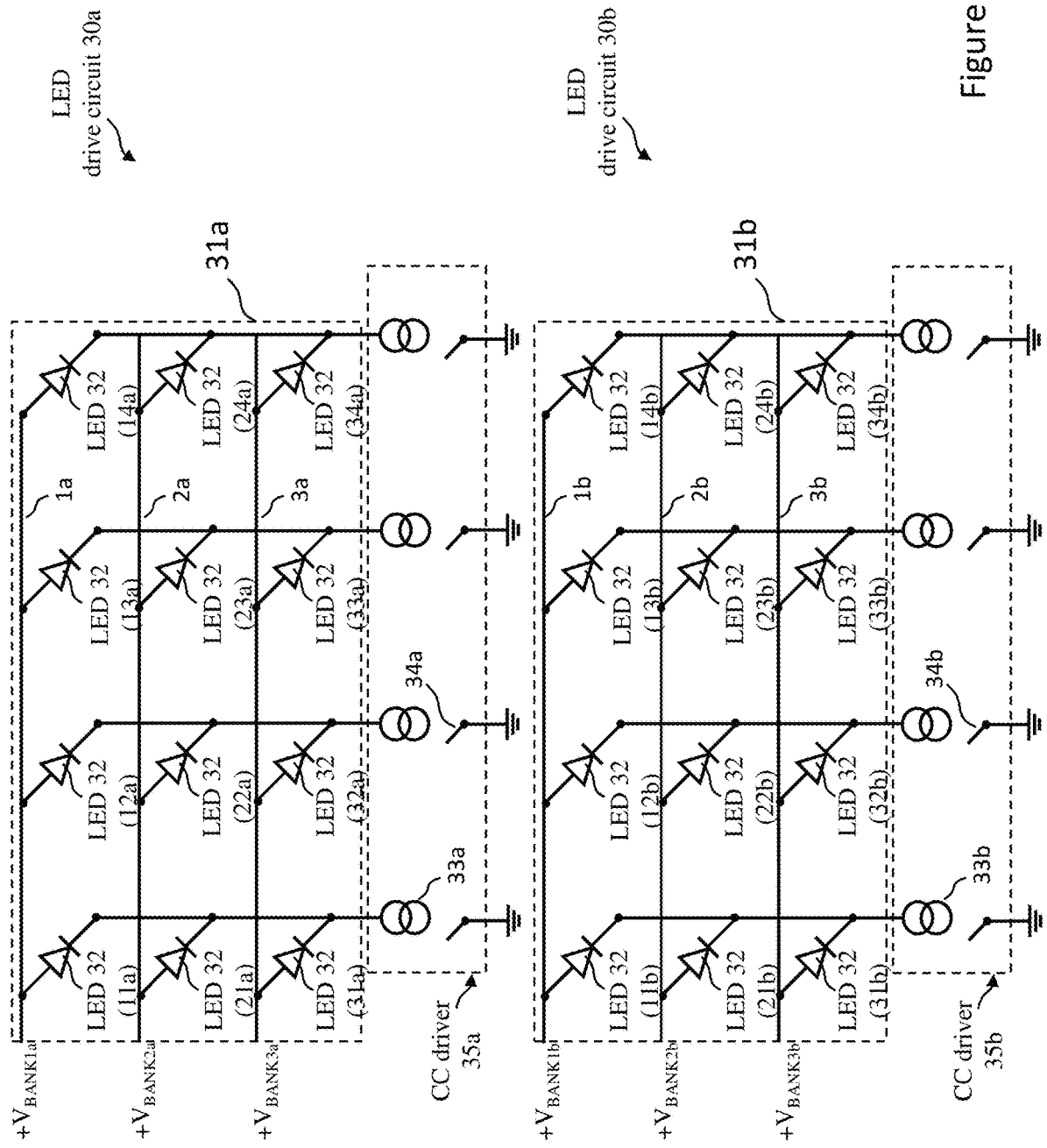
FIG. 3 shows a schematic diagram of a passive matrix LED display having two LED drive circuits, wherein the LEDs are arranged in a common anode configuration, wherein each of the LED drive circuit being configured as a common anode drive device.

FIG. 2(a) is rather a simplified version of what is represented in more detail in FIG. 3. Corresponding FIG. 3 shows a schematic diagram of the same LED display with 6 rows and 4 columns having two LED drive circuits 30a, 30b (i.e. 'a' and 'b' circuit), wherein the LEDs 32 are arranged in a common anode configuration, and wherein each of the LED drive circuits 30a, 30b being configured as a common anode drive device. Each of the LEDs 32 are indicated with their respective position (between brackets) in one of the LED arrays 31a, 31b. A first constant current (CC) driver 35a drives cathode side of all LEDs xxa (or 'a' LEDs) wherein the rows 1a, 2a, 3a are selected by Vbank1a, Vbank2a, Vbank3a power supply respectively (together Vbanka power supplies). Since all 'a' LEDs are part of the LED array 31a of the first drive circuit 30a, the first CC driver 35a is (to be) connected to the 'a' drive circuit 30a. A second constant current (CC) driver 35b drives cathode side of the LEDs xxb (or 'b' LEDs) and the rows 1b, 2b, 3b are selected by Vbank1b, Vbank2b, Vbank3b power supply respectively (together Vbankb power supplies). While all 'b' LEDs are part of the LED array 31b of the second drive circuit 30b, the second CC driver 35b is (to be) connected to the 'b' drive circuit 30b. In FIG. 3 is further shown that the first constant current driver 35a comprises individual current sources or drivers 33a (here, four in total) that may be coupled via respective switches 34a (also four in total here). The second constant current driver 35b comprises individual current sources or drivers 33b (again here, four in total) that may be coupled via respective switches 34b (also four in total here). It is noted that Vbanka power supplies may have a different or at least separate start-stop sequence in comparison to Vbankb power supplies, as is depicted in FIG. 4 which will be further discussed below with the description thereof.

Figure 4:
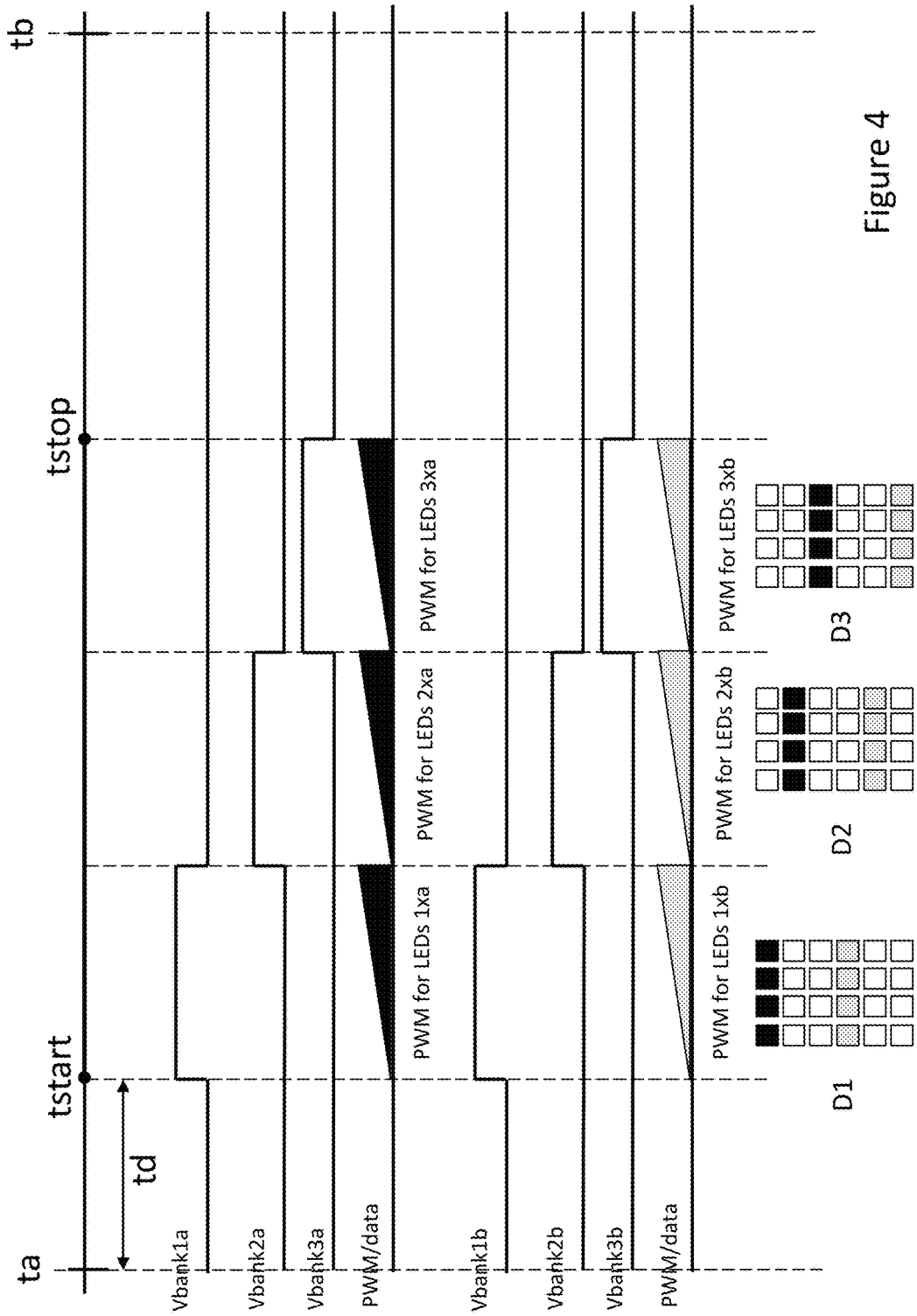
FIG. 4 shows a typical time scheme used for related multiplexed displays.

FIG. 4, which corresponds to the logic circuit of FIG. 2(a), or FIG. 3, shows a time scheme used for related multiplexed displays. As mentioned above, Vbanka power supplies may have a different or at least separate start-stop sequence as compared to Vbankb power supplies. In this case of FIG. 4 e.g. Vbank1a is asserted together with Vbank1b. Moreover, here, the datastreams of Vbank1a, Vbank2a, Vbank3a are overlapping respectively with the datastreams of Vbank1b, Vbank2b, Vbank3b within the tstart-tstop period, during which the light output of the LEDs is represented by the respective below picture D1, D2, D3 (cfr. physical layout of the LED board) in a 6×4 matrix. The constant current drivers generate PWM signals to drive the LEDs. The below picture D1, D2, D3 shows what LEDs light up in a particular time slot or time period. The pictures D1, D2, D3 being the LED array representation for three different consecutive time slots within tstart-tstop period. For example, in picture D1 is shown that the 'a' LEDs of first row (of LED array 31a), and the 'b' LEDs of fourth row (or first row of LED array 31b) are lighting up.

According to the sync-banding method explained earlier (for eliminating banding effects e.g. in "Studio display" (U.S. patent application Ser. No. 16/895,872), and "Studio2" (U.S. patent application Ser. No. 17/865,096)), at time ta (also known as the vertical sync) a programmable delay td occurs, whereafter the multiplexing and PWM generation will start at time tstart. The start of (showing) the image (on the display) can be delayed or moved to avoid so-called banding or banding effects and thus to ensure that the image is in the visibility window (i.e., part or ribbon viewed on camera) of the camera shutter (opening) time. Banding is known in the art, being the effect that banding or bands appears on camera when a camera is used to record a display image (in the background). When watching the news or sports on TV, for example, and behind the speaker or journalist is a (LED) screen mounted with video or image displayed thereon, it is common that the screen in the back shows the video or image with banding effects. In case of a LED screen for example, this banding phenomena is (mainly) caused by the PWM (pulse-width modulation) signal of the image being shown on the display, in particular because the shutter (opening) time of the camera may start at different positions of the PWM (i.e. at lower power/brightness versus higher power/brightness), hence showing alternatingly brighter and darker images, resulting in images shown with bands having brighter and darker strips or parts. In addition to time ta, a next vertical sync time tb is shown in the drawing. Also, according to this sync-banding method, there is a programmable end at time tstop. In between these tstart and tstop times, PWM generation occurs to light up the LEDs. In FIG. 4 is shown that, by means of example, Vbank1a (and Vbank2a, Vbank3a) is only one time slot 'high' in one tstart-tstop period.

Whereas a passive matrix (PM) display, having a multiplexing schematic such as, for example, illustrated in FIG. 1, uses a simple conductive grid to apply a voltage to the light-emitting elements (LEEs) such as e.g. light-emitting diodes (LEDs) in the target area, an active matrix (AM) display uses a grid of transistors and capacitors with the ability to hold a charge for a limited period of time. The active matrix pixel drive scheme is a drive scheme wherein the pixel (e.g., LED or OLED) is supposed to light up constantly in comparison to the passive matrix pixel drive scheme.

Figure 5:
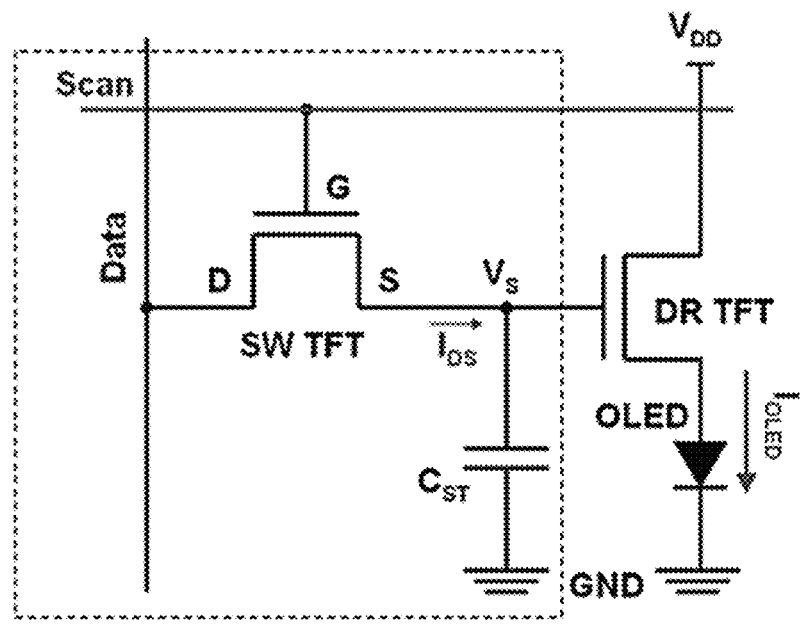
FIG. 5 shows a schematic of a related active matrix OLED pixel electrode circuit with two transistors and a storage capacitor.

A typical example of the electronics or the pixel electrode circuit for an active matrix organic light-emitting (OLED) display is shown in FIG. 5. The active matrix OLED pixel circuit here contains two transistors (TFTs), i.e. a switching TFT and a driving TFT, and one storage capacitor $C_{ST}$. When the switching TFT (SW TFT) is turned on during the programming state, the data signal voltage is stored at the storage capacitor through the switching TFT. Then, when the switching TFT is turned off during the driving state, the stored data voltage in the capacitor $C_{ST}$ will generate the node voltage $V_S$ at the gate electrode of the driving TFT (DR TFT), which will maintain the constant OLED current flow through the driving TFT, and light emission from the OLED will occur. Since the gate voltage of the DR TFT ($V_{DD}$) is a de bias high enough to make the DR TFT work in the saturation regime, the level and shape of the OLED current is solely determined by the gate voltage of the DR TFT ($V_S$) during operation. In dynamic pixel operation, two main properties of the transistor are important, i.e. the pixel charging performance and the feedthrough voltage. The charging time of the pixel circuit (meaning the time required to charge up the storage capacitor in the pixel electrode circuit to the programmed level) determines the switching speed of the switching TFT and the programming speed of the driving TFT. It is noted that in the real display, two charging steps occur at the same time for charging the data voltage to the gate node of the driving TFT in the pixel. First charging step comprises data line charging from the driver IC to the drain node of the switching TFT involving the cross area of the data line and the scan line. Second charging step comprises pixel charging from the data line to the gate node of the driving TFT. The feedthrough voltage being another important characteristic, is now further discussed. During pixel circuit operation, the potential at the gate node of the driving TFT $V_S$ is supposed to remain constant and should be maintained at this value by the storage capacitor $C_{ST}$ connected to the gate node during the driving state. An exact programmed OLED current during the pixel driving stage is hence provided. However, due to the switching TFT dynamic operation, the gate node of the driving TFT suffers a potential variation, known as the feedthrough voltage, due to the parasitic capacitor of the switching TFT. The presence of the feedthrough voltage will induce the dc offset voltage across the driving TFT and may influence the amplitude of the OLED current flowing through the driving TFT.

Figure 7:
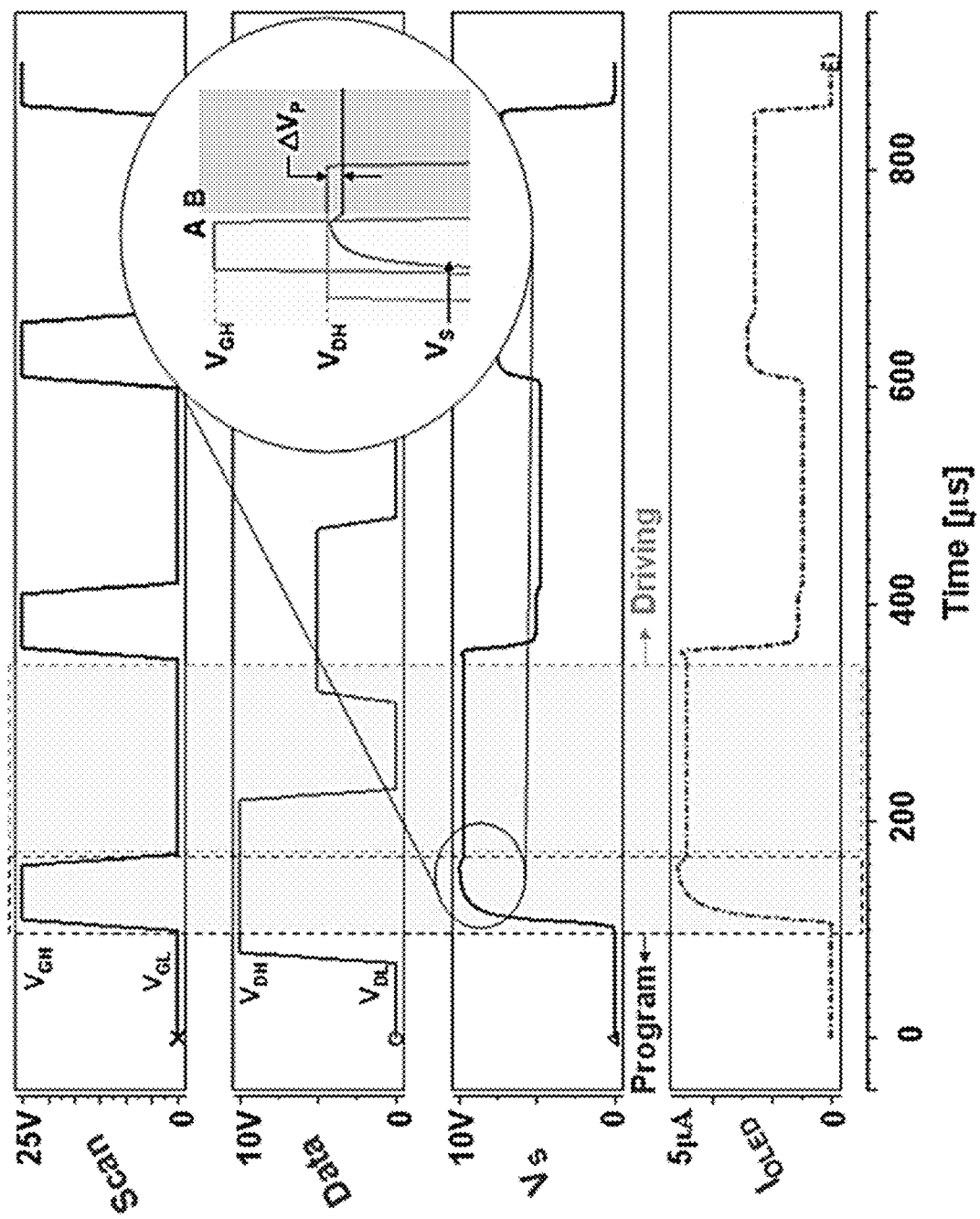
FIG. 7 shows an example of the operational driving signal waveforms during programming and driving states corresponding to the schematic of FIG. 5.

Corresponding to the schematic of FIG. 5, an example of the evolving signals over time is shown in FIG. 7, for respectively scan line, data line, node voltage and OLED current. In particular, FIG. 7 shows an example of operational waveforms of the Scan and Data input signals, and the pixel voltage variation $V_S$ measured at the storage capacitor $C_{ST}$, wherein $V_{GH}$ and $V_{GL}$ are the high and low levels of gate voltage, respectively, and $V_{DH}$ and $V_{DL}$ are the high and low levels of drain voltage, respectively. The data voltage pulse (Data) is first applied to the drain electrode of the switching TFT. Whenever the gate voltage pulse (Scan) is applied to the gate electrode of the SW TFT, the SW TFT is turned on, and the storage capacitor $C_{ST}$ is charged up to the data voltage (here e.g. 10V) during the one scan line time. When the gate pulse is removed, the data (or pixel) voltage is stored at the storage capacitor $C_{ST}$ until the next gate and data signals are applied to reset the storage capacitor $C_{ST}$ with a new data voltage (here e.g. 5V) for the next frame time. It is noted that there is a voltage drop occurring at the falling edge of the gate signal, shown in more detail in the zoom-out circle. Indicated A and B (block) therein, represent the time right before and after the falling edge of gate pulse, respectively. The voltage drop is caused by the parasitic capacitance of the switching TFT. When de scan line goes high for a particular pixel, one can apply a data voltage that is stored in the capacitor, defining also the current going through the OLED. In fact, part of the scheme principle of FIG. 7, i.e. Scan and Data signals, can be more or less compared to Vbanka and PWM/data signals of FIG. 4. The big difference however is that in case of FIG. 7, the light output ($I_{OLED}$) remains defined until a new voltage ($V_S$) is applied. Further referring to FIG. 7, one can say the voltage is 'programmed' and subsequently this voltage is used to define current through the OLED, i.e. herewith 'driving' the OLED.

In FIG. 8, a related active matrix (multi) LED display is depicted with 24 LEDs, i.e. twice a 3×4 matrix of LEDs or twice an array of 12 LEDs arranged as 3×4. The active matrix LED display is schematically represented having two LED drive circuits 80*a*, 80*b* (i.e. 'a' and 'b' circuit). For each drive circuit 80*a*, 80*b* the LEDs are arranged in corresponding LED array 81*a*. Each of the LEDs are indicated with their respective position in the LED array 81*a*, 81*b* of either 'a' or 'b' circuit respectively. In this example, a first set of data voltages Data1*a*, Data2*a*, Data3*a*, Data4*a* is applied to the (gate electrode of) driving TFT of all LEDs xxa (or 'a' LEDs) wherein the rows 1*a*, 2*a*, 3*a* are powered by scan voltages Scan1*a*, Scan2*a*, Scan3*a* respectively (together Scanxa voltages). Since all 'a' LEDs are part of the LED array 81*a* of the 'a' drive circuit 80*a*, the data voltages Data1*a*, Data2*a*, Data3*a*, Data4*a* are (to be) supplied to the 'a' drive circuit 80*a*. Similarly, a second set of data voltages Data1*b*, Data2*b*, Data3*b*, Data4*b* is applied to the (gate electrode of) driving TFT of all LEDs xxb (or 'b' LEDs) and the rows 1*b*, 2*b*, 3*b* are powered by scan voltages Scan1*b*, Scan2*b*, Scan3*b* respectively (together Scanxb voltages). While all 'b' LEDs are part of the LED array 81*b* of the 'b' drive circuit 80*b*, the data voltages Data1*b*, Data2*b*, Data3*a*, Data4*b* are (to be) supplied to the 'b' drive circuit 80*b*.

In accordance with an embodiment of the invention, FIG. 9 is a new configuration wherein LEDs with connection to a first set of data voltages are intermittently placed in between those driven by a second set of data voltages, and vice versa. FIG. 9 shows an embodiment of a schematic arrangement, or what may be termed an interleaving arrangement, of a LED display having two LED drive circuits 90*a*, 90*b*. For each drive circuit 90*a*, 90*b*, the LEDs are arranged in a LED array 91*a*, 91*b*. Each of the LEDs are indicated with their respective position in one of the LED arrays 91*a*, 91*b* of either first or second drive circuit respectively. In the embodiment, 'a' and 'b' LEDs are both shown either in the LED array 91*a* of the first drive circuit 90*a*, as in the LED array 91*b* of the second drive circuit 90*b*. A first set of data voltages Data1*a*, Data2*a*, Data3*a*, Data4*a* (together Dataxa voltages) is applied to all LEDs xxa (or 'a' LEDs) wherein the rows 1*a*, 2*a*, 3*a* are powered by scan voltages Scan1*a*, Scan2*a*, Scan3*a* respectively (together Scanxa voltages). A second set of data voltages Data1*b*, Data2*b*, Data3*b*, Data4*b* (together Dataxb voltages) is applied of the LEDs xxb (or 'b' LEDs) and the rows 1*b*, 2*b*, 3*b* are powered by Scan1*b*, Scan2*b*, Scan3*b* power supply respectively (together Scanxb voltages). Hence, 'a' LEDs are driven by the first set of data voltages Dataxa, whereas 'b' LEDs are driven by the second set of data voltages Dataxb. Although the first set of data voltages Dataxa is part of the first drive circuit 90*a*, and the second set of data voltages Dataxb is part of the second drive circuit 90*b*, this is no longer clearly depicted, whereas 'a' and 'b' LEDs are now mixed up in both drive circuits.

According to the embodiment, one or more, or a few 'a' LEDs driven by the first set of data voltages Dataxa of the first drive circuit 90*a* are residing physically within the second drive circuit 90*b*, or in other words, within an area of pixels, amongst pixels, and/or between pixels driven by the second drive circuit 90*b*. In addition, one or more, or a few 'b' LEDs driven by the second set of data voltages Dataxb of the second drive circuit 90*b* are residing physically within the first drive circuit 90*a*, or in other words, within an area of pixels, amongst pixels, and/or between pixels driven by the first drive circuit 90*a*. This means that some of the LEDs xxa (or 'a' LEDs) appear in the second drive circuit 90*b*, whereas some of the LEDs xxb (or 'b' LEDs) appear in the first drive circuit 90*a*. The 'a' LEDs are however still (to be) empowered by one of the respective Scanxa voltages via one of the corresponding rows 1*a*, 2*a*, 3*a*, whereas 'b' LEDs are (to be) empowered by one of the respective Scanxb voltages via one of the corresponding rows 1*b*, 2*b*, 3*b*. As a result, in FIG. 9, 'a' and 'b' rows are shown for each of the drive circuits 90*a*, 90*b*. As shown, by means of example, here only the first column (1*a*) of the 'a' LEDs, i.e. of LED array 91*a* have remained in the same place, as well as the fourth column (4*b*) of the 'b' LEDs, i.e. of LED array 91*b*. All other columns are interleaved and changed place (1*b*, 2*b*, 3*a*, 4*a*) or only changed place (2*a*, 3*b*) within one or the other array 91*a*, 91*b*. The 'a' LEDs (13*a*, 23*a*, 33*a*, 14*a*, 24*a*, 34*a*) that are driven by the first set of data voltages Data3*a*, Data4*a* are appearing in the second drive circuit 90*b*, whereas 'b' LEDs (11*b*, 21*b*, 31*b*, 12*b*, 22*b*, 32*b*) that are driven by the second set of data voltages Data1*b*, Data2*b* are appearing in the first drive circuit 90*a*.

Figure 10:
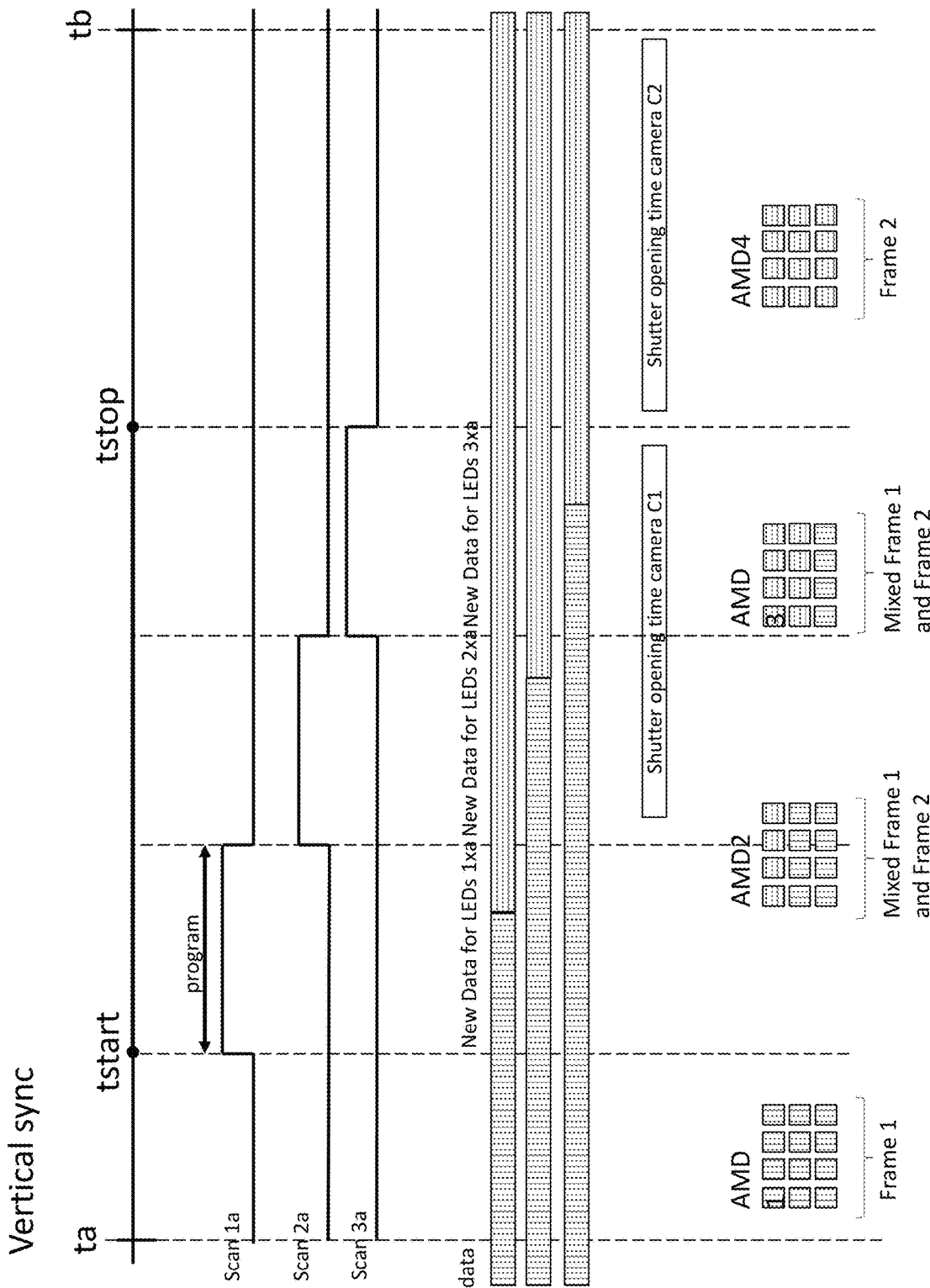
FIG. 10 shows a typical time scheme used for related active matrix displays, illustrating scan and data signals, including what is shown on the LED display for different time slots.

FIG. 10, corresponding partially to the logic circuit of FIG. 8, shows a typical time scheme used for related active matrix displays, illustrating scan and data signals, including what is shown on the active matrix LED display (i.e. which LEDs of the display light up with what kind of data) for different time slots. The scan signals Scan1*a*, Scan2*a*, Scan3*a* are overlapping with the data signals within the tstart-tstop period, during which the light output of the LEDs is represented by the respective below picture AMD1, AMD2, AMD3, AMD4 (cfr. physical layout of the LED board) in a 3×4 matrix. The data signals are intended for the LEDs (here specifically 'a' LEDs), and represent two consecutive frames to be shown on the display (of which the data per row is submitted). The below pictures AMD1, AMD2, AMD3, AMD4 show what LEDs light up in a particular time slot or time period. The pictures AMD1, AMD2, AMD3, AMD4 being the LED array representation for four different consecutive time slots just before, within and just after the tstart-tstop period. For example, in picture AMD1 just before the tstart-tstop period, a first frame, i.e. Frame 1, of which corresponding data signal is being submitted to all three rows 1, 2, 3 of the display, is shown for all 'a' LEDs, and thus on all rows 1, 2, 3 of the display. Within the tstart-tstop period, a second frame, i.e. Frame 2, is intended to be shown, of which corresponding data signal is again being submitted to all three rows 1, 2, 3 of the display, however, not all simultaneously. First, new data is delivered for row 1, then new data for row 2, and finally new data for row 3. Moreover, the scan signals per row are not overlapping, but occurring one after the other. First Scan1*a* is high, then Scan2a, and finally Scan3a within the tstart-tstop period. When Scan1a is high, new data for row 1 comes in, and hence at this time, new data is shown on the display for row 1, as depicted in AMD2. For the other rows (row 2 and 3), we don't have new data yet. When Scan2a is high, new data for row 2 comes in, and hence from this time on, new data is shown on the display for row 2, as depicted in AMD3, although AMD3 represents the display when Scan2a is already low, and Scan3a is high. The pictures AMD2, AMD3 represent a mix of the two frames, Frame 1 and Frame 2, and moreover, this mix is different for pictures AMD2, AMD3 respectively (due to the data signal and corresponding frame (Frame 1 and/or Frame 2) per row coming in). During the time when Scan3a is high, new data for row 3 comes in. From this time on, new data is shown on the display for row 3. The output on the display is shown on a later time with AMD4, wherein all three rows are now represented by new data (Frame 2). More particularly, just after the tstart-tstop period, the second frame, i.e. Frame 2, of which corresponding data signal is being submitted to all three rows 1, 2, 3 of the display, is shown for all 'a' LEDs, and thus on all rows 1, 2, 3 of the display, as depicted in picture AMD4.

Figure 11:
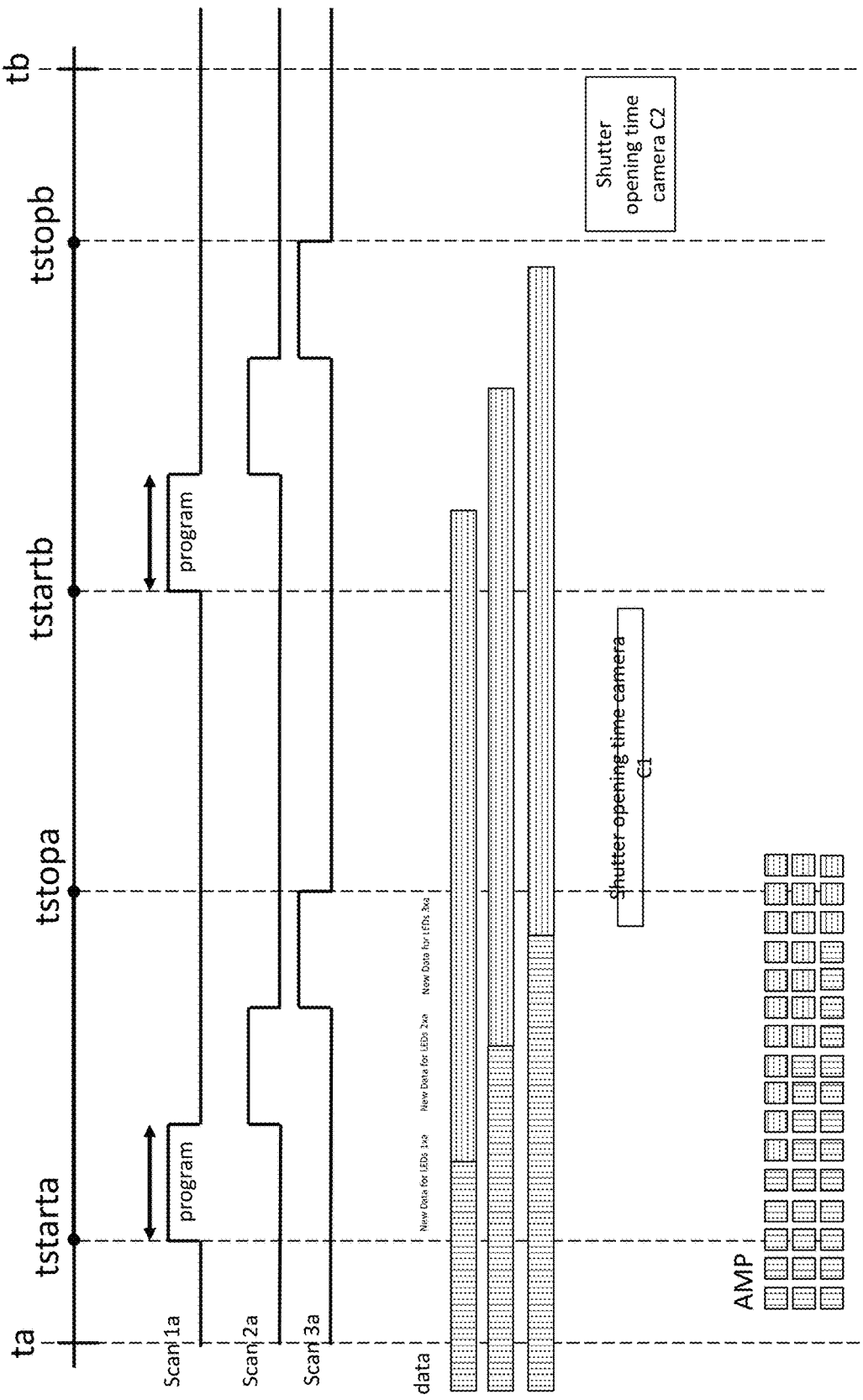
FIG. 11 shows an embodiment in the time domain of an active matrix display, illustrating scan and data signals (with frequency variation), including corresponding display output, and the camera view, in accordance with the invention.

Considering now the active matrix display being a light source display, comprising light-emitting elements, e.g. in a studio environment with a camera (or a plurality of cameras) recording the image displayed by the display. As the light-emitting elements (LEEs) such as e.g. light-emitting diodes (LEDs) always light up in an active matrix display, the banding effect in this case, and hence also the effect of sync-banding will be very low. On the other hand, as for example illustrated in FIG. 10 in the display output AMD2 and AMD3, particularly within the tstart-tstop period, wherein Frame 1 and Frame 2 are mixed, multiple frames can be seen by a camera C1 during its shutter opening time. As shown, the camera C1 will see or record an image during its shutter opening time a mix (in time) of the image from previous frame, i.e. Frame 1, and the image of current or new frame, i.e. Frame 2. Hence, for this particular example, tstart and tstop logic should be used oppositely as compared to the sync-banding principle described in "Studio display" and "Studio2" patent applications (U.S. patent application Ser. No. 16/895,872 and U.S. patent application Ser. No. 17/865,096, respectively) for passive matrix displays. It should be defined in such way, or at least it is desirable, that data is not updated (cfr. frame refresh) during the period when the camera shutter opening time is active, or at least the data update is minimal in case the scan frequency is limited. In FIG. 10, all data updates (from Frame 1 to Frame 2) are done or completed for a camera C2 with shutter opening time outside, i.e. just after the tstart-tstop period. Given number of scan lines cannot be used in parallel. Therefore, it is particularly advantageous to calculate a scan line frequency, such that all data updates are finished before the start of the shutter opening time of one of the cameras C1, C2 is reached. A variation of the scan line frequency, representing two program cycles instead of just one within one ta-tb period, is shown in FIG. 11, hence depicting multiple starts and stops. Here, the shutter opening time for both cameras C1, C2 respectively is lying entirely outside the time slots wherein data updates are taking place. In FIG. 11, the image is stable for camera C1 as well as for camera C2, each being capable of seeing a different image. The below picture AMP show what LEDs light up in function of the time and the (variation of the) scan and data signals. The picture AMP being the LED array representation for consecutive times just before, within and just after the tstarta-tstopa period. It is further noted that on a video processing level, the data can be updated immediately once new pixel data (data signal) comes in. As a result, there is no need to wait for a or another vertical sync to arrive, to update the data. Hence, latency can be reduced. As opposed to PWM/data in passive matrix displays, for the eye being averaged over time for a particular period, the program scan in active matrix display leads to an immediate signal, for the eye at instant value that is remained over time for the particular period.

Figure 12:
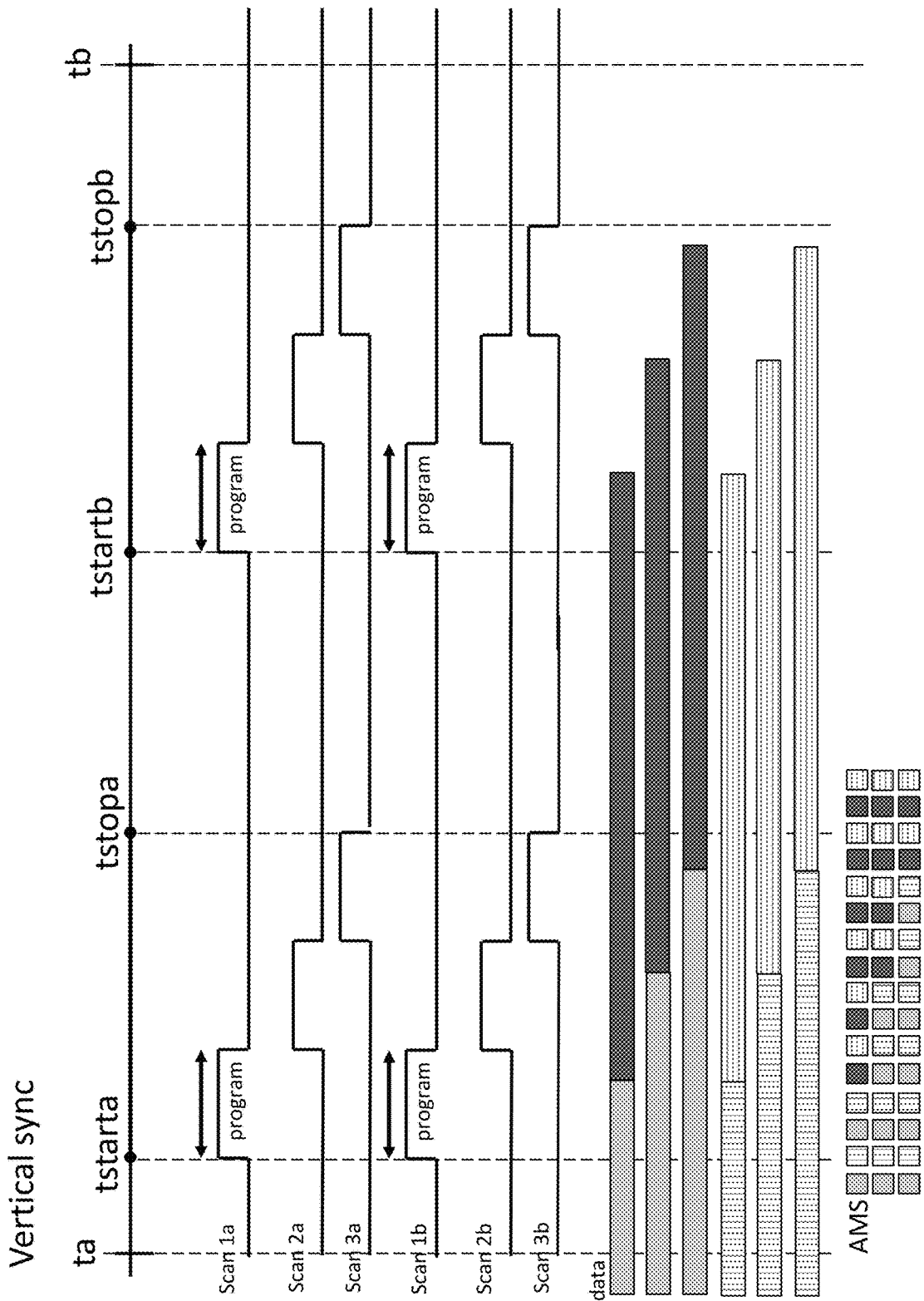
FIG. 12 shows an embodiment in the time domain of an active matrix display, illustrating double scan and data signals (with frequency variation), including corresponding display output, in accordance with the invention.

FIG. 12 shows an embodiment in the time domain, illustrating double scan (Scanxa, Scanxb) and data signals (with frequency variation), including corresponding display output AMS, in accordance with the invention. In particular, it shows a timing scheme of a new proposed layout of an active matrix drive, using in this example two different scan streams, as for example shown in FIG. 9. This scheme can be used for example for a 3D display application wherein e.g. a lenticular lens or screen, or polarizers, are provided in front of the light-emitting elements or LEDs. According to an embodiment, the 'a' LEDs represent data for left eye and the 'b' LEDs represent data for the right eye. This alteration of schematics is particularly useful in case the display is capable of receiving two different video data streams, each meant for different scan lines (in this example Scanxa and Scanxb). Furthermore, two different scans can go along in parallel, such that the data gets updated in parallel, hence decreasing the total time needed to update the display (e.g. half the time in case of two scans). As a result, the response can go much faster and can also accommodate for camera shutter update in case it is too wide to be done in a single sequence.

Figure 6:
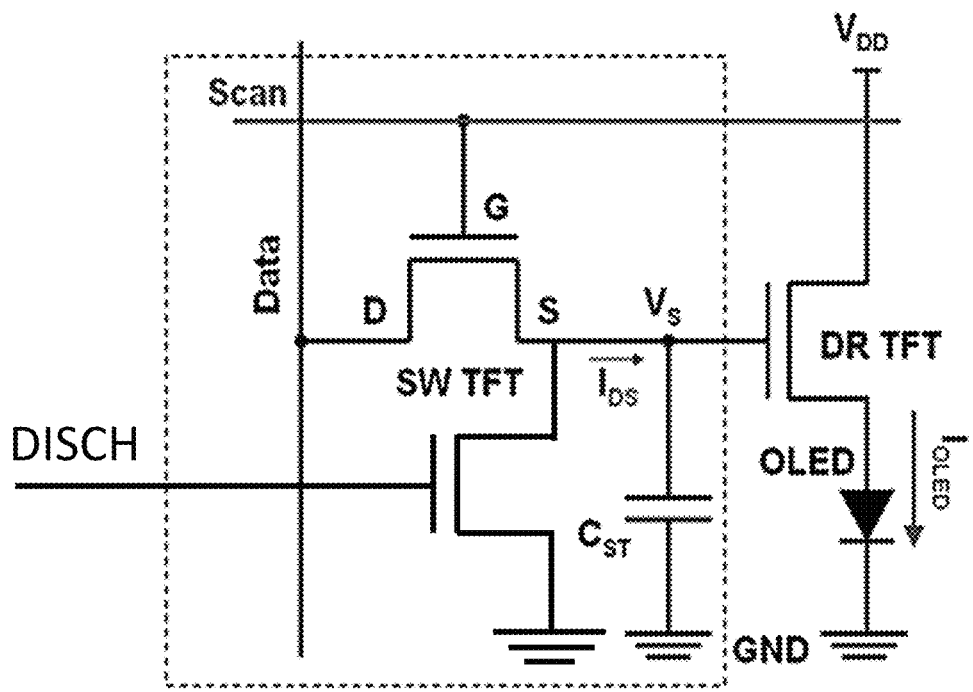
FIG. 6 shows an embodiment of an active matrix display OLED pixel electrode circuit having three transistors and a storage capacitor, in accordance with the invention.

FIG. 6 shows an embodiment of an active matrix display OLED pixel electrode circuit having three transistors, instead of two as in FIG. 5, and a storage capacitor, in accordance with the invention. In addition to the switching TFT and the driving TFT, a further transistor is provided. In other words, here an additional transistor e.g. TFT or FET is proposed for each OLED or pixel. When this transistor is activated, regardless of scan and/or data signals, the storage capacitor $C_{ST}$ is discharged, and hence no current runs any longer through the OLED. This will allow to immediately put all pixels to OFF state without having them to individually address with 'data value 0'. This functionality is extremely handy when wanting to show e.g. active 3D while maintaining a simple 60 Hz refresh function (so, there is no need to go to 120 Hz).

Figure 13:
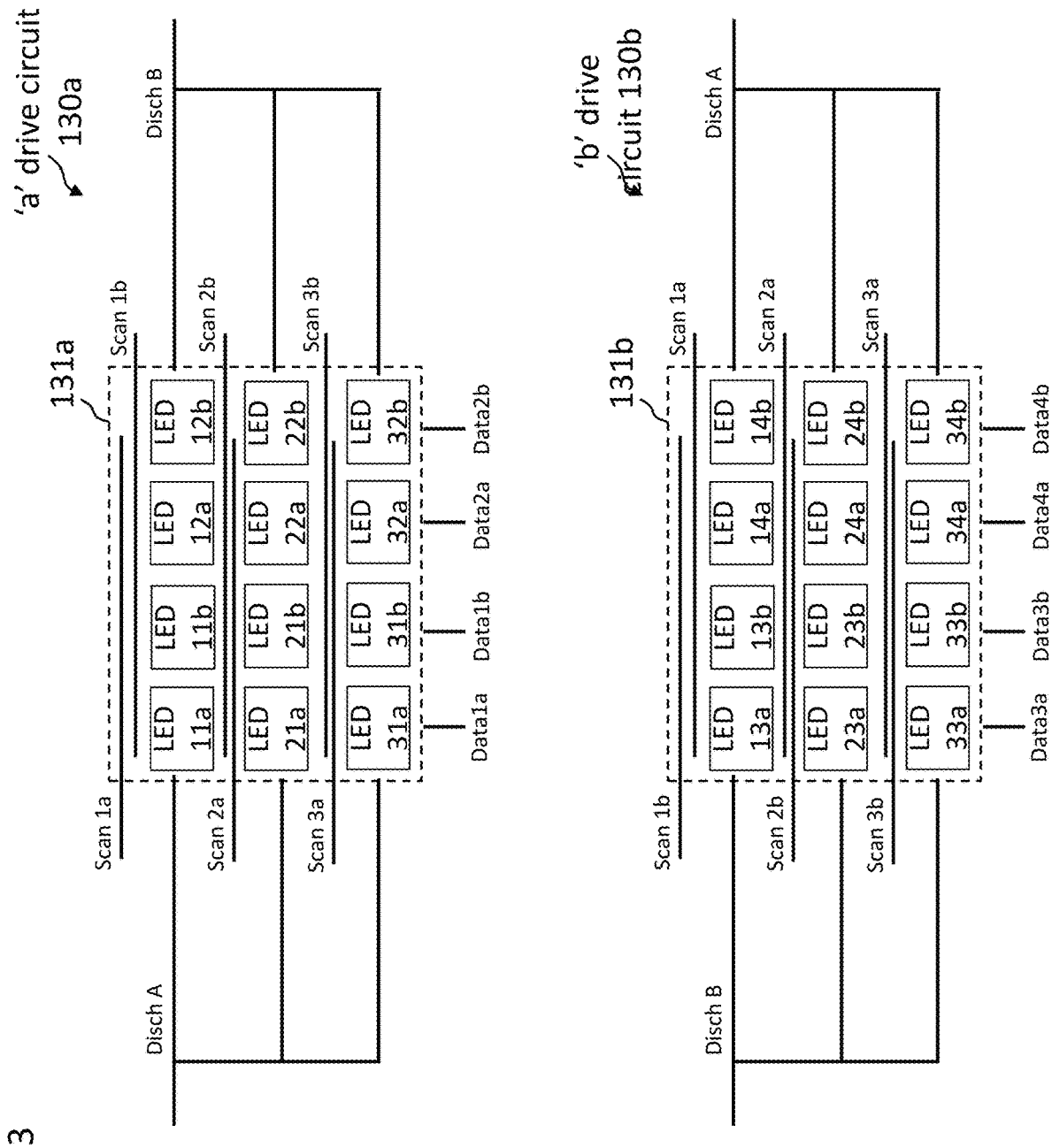
FIG. 13 shows a schematic embodiment of an active matrix LED display having two LED drive circuits, wherein LEDs driven by a first set of data voltages of a first drive circuit are residing physically with a second drive circuit, and vice versa, and wherein each of the LED drive circuits comprises an additional discharging transistor, in accordance with the invention.

FIG. 13 shows a schematic embodiment of an active matrix LED display having two LED drive circuits, wherein LEDs driven by a first set of data voltages of a first drive circuit are residing physically within a second drive circuit, and vice versa (as for example earlier depicted in FIG. 9), and wherein each of the LED drive circuits comprises an additional discharging transistor, in accordance with the invention. In particular, it shows a layout of in this case two different scan topologies (Scanxa and Scanxb).

Figure 14:
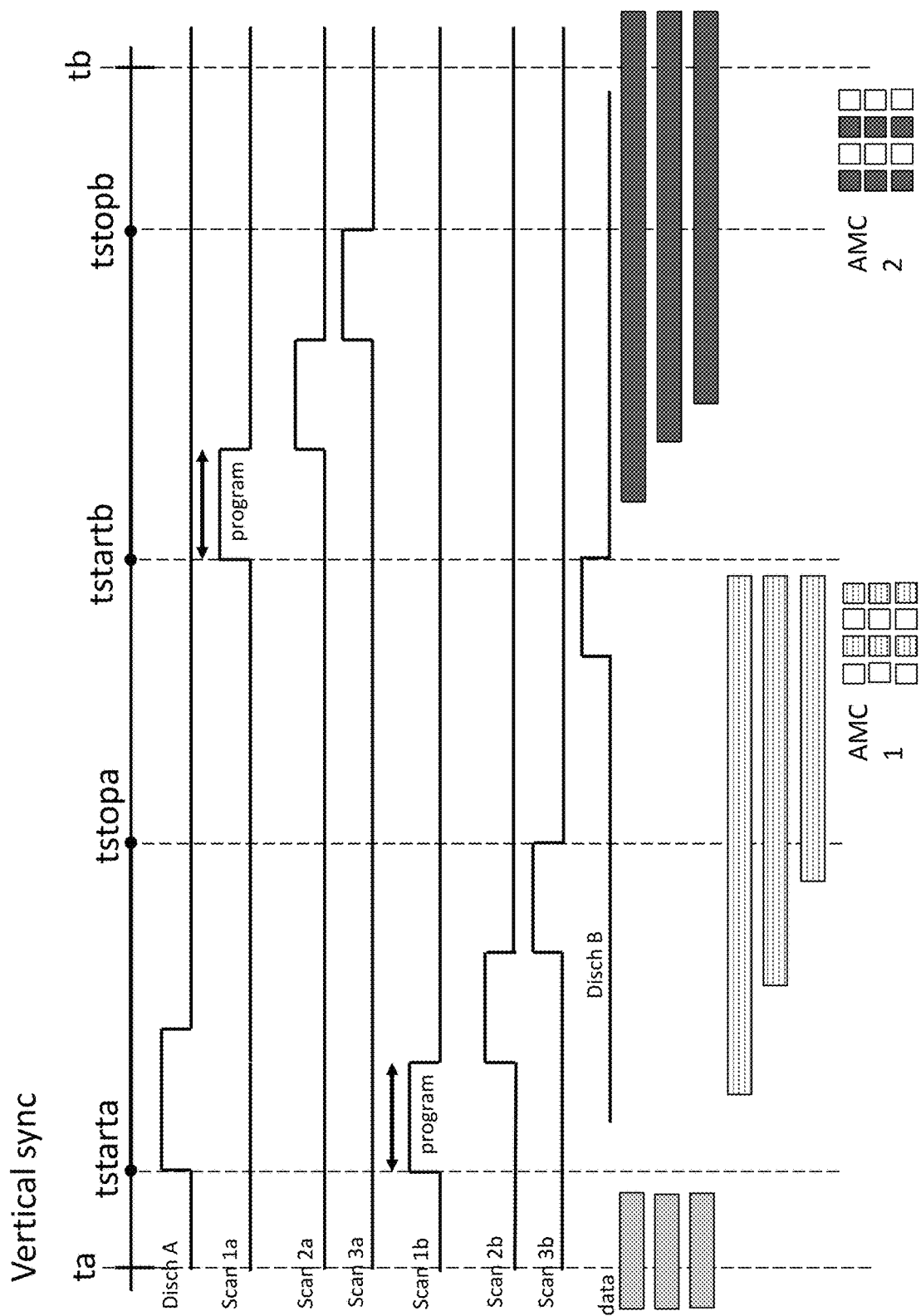
FIG. 14 shows an embodiment in the time domain of an active matrix display, illustrating double scan, data and discharging transistor signals, including corresponding display output, in accordance with the invention.

FIG. 14 shows an embodiment in the time domain, illustrating double scan (Scanxa, Scanxb), data and discharging transistor signals (Disch A, Disch B), including corresponding display output (AMC1, AMC2), in accordance with the invention. FIG. 14 shows an example of usage of the scheme in FIG. 13. When discharge A (Disch A) is put high, all LEDs related to Scana will go to OFF state. Once loading of the capacitor is finished, the LEDs will be programmed and get their respective value. In, for example, an active 3D system, then all LEDs for the right eye, for example, are lit up. Subsequently, discharge B (Disch B) is asserted and the right eye channel LEDs go out and the left eye channel is programmed for. By using this scheme, there is no overspill (i.e. data signal stops) from right to left eye channel as the opposite LEDs allocated to left and right eye are enabled/disabled (and this all is done in the same Vsync).

Different calibration values (or calibration data) may also be assigned for the Scanxa related pixels compared to the Scanxb related pixels, and hence the system also accommodates for multi camera view and using different calibrations.

Combinability of Embodiments and Features

This disclosure provides various examples, embodiments, features, and methods of an active matrix display, which improve a visual performance of a AM display and/or a camera recording an image from the AM display. Unless expressly stated, or unless such examples, embodiments, and features would be mutually exclusive, the various examples, embodiments, features, and methods disclosed herein should be understood to be combinable with other examples, embodiments, features, or methods described herein.

In addition to the above, further embodiments and examples include the following enumerated embodiments and methods 1. An active matrix display comprising: a plurality of pixel circuits, comprising each a light-emitting element, at least two transistors and a storage capacitor, wherein one of the at least two transistors is intended for discharging purposes of the storage capacitor.
2. The active matrix display according to any one or a combination of 1 above and/or 3-8 below, wherein each of the plurality of pixel circuits being connected to scan signal lines and data signal lines, providing scan signals and data signals respectively, is further connected to one or more (dedicated) discharge signal lines each providing a discharge signal.
3. The active matrix according to any one or a combination of 1-2 above and/or 4-8 below, displaying an image that is defined by scan signals and data signals, wherein the scan signals having a programmable start and stop.
4. The active matrix display according to any one or a combination of 1-3 above and/or 5-8 below, wherein the image being displayed is recorded by one or more cameras each having a shutter and corresponding shutter opening time defined as the time when the shutter is open, wherein the scan signals are on or off in function of time and the data signals are updated in time, wherein off-to-on time of the scan signals, defined as the time where the scan signal changes from off to on state, and update time of the data signals are programmed in relation to the operation of the one or more cameras.
5. The active matrix display according to any one or a combination of 1-4 above and/or 6-8 below, wherein the discharge signals are asserted at programmable timing to immediately cease light output of the light-emitting elements of each of the plurality of pixel circuits.
6. The active matrix display according to any one or a combination of 1-5 above and/or 7-8 below, wherein the discharge signals are also asserted in relation to the operation of the one or more cameras, in particular in relation to their shutter opening time.
7. The active matrix display according to any one or a combination of 1-6 above and/or 8 below, comprising at least two drive circuits, each having a scan signal set and per scan signal set having one of the one or more (dedicated) discharge signal lines.
8. The active matrix display according to any one or a combination of 1-7 above, wherein each of the scan signal sets represents the scan signals for a (different) video data stream, and the image being displayed is video, in particular active 3D video in case a lenticular lens array is placed on top of the light-emitting elements of the plurality of pixel circuits.
9. An active matrix display comprising: a plurality of pixel circuits, comprising each a light-emitting element, one or more transistors and a storage capacitor, each of the plurality of pixel circuits having a first connection point and a second connection point, and being connected at their first connection point to first lines and at their second connection point to second lines; and at least two drive circuits, each of the drive circuits having electrical connections defined by rows and columns that electrically connect to the pixel circuits (each of the drive circuits being configured as a drive device); wherein each of the first lines is arranged to be connected to a data signal line (of a data driver), connected to one of the columns of the corresponding drive circuit, and providing a data signal for driving one of the columns of the corresponding drive circuit; each of the second lines is arranged to be connected to a scan signal line (of a scanning unit), connected to one of the rows of the corresponding drive circuit, and providing a scan signal to one of the rows of the corresponding drive circuit; the at least two drive circuits include a first drive circuit and a second drive circuit; and at least one of the plurality of pixel circuits driven by the data signals (or data driver) of the first drive circuit is residing physically within the second drive circuit, or, at least one of the plurality of pixel circuits driven by the data signals (or data driver) of the second drive circuit is residing physically within the first drive circuit.
10. The active matrix display according to any one or a combination of 9 above and/or 11-14 below, displaying an image that is defined by scan signals and data signals, comprises per drive circuit a scan signal set, wherein each of the scan signal sets having a programmable start and stop.
11. The active matrix display according to any one or a combination of 9-10 above and/or 12-14 below, wherein each of the scan signal sets represents the scan signals for a (different) video data stream (hence, while having at least two drive circuits and thus at least two scan signal sets, there are at least two video data streams).
12. The active matrix display according to any one or a combination of 9-11 above and/or 13-14 below, wherein the image being displayed is recorded by one or more cameras each having a shutter and corresponding shutter opening time defined as the time when the shutter is open, wherein the scan signals are on or off in function of time and the data signals are updated in time, wherein off-to-on time of the scan signals, defined as the time where the scan signal changes from off to on state, and update time of the data signals are programmed in relation to the operation of the camera.
13. The active matrix display according to any one or a combination of 9-12 above and/or 14 below, wherein off-to-on time of the scan signals and update time of the data signals are occurring out of the shutter opening time of the one or more cameras (i.e. when the shutter of the one or more cameras is closed).

14. The active matrix according to any one or a combination of 9-13 above, wherein a lenticular lens array is placed on top of the light-emitting elements of the plurality of pixel circuits comprising lenses with different viewing angle for each of the scan signal sets.

15. An active matrix display displaying an image that is recorded by one or more cameras each having a shutter and corresponding shutter opening time defined as the time when the shutter is open, and the image being displayed is defined by scan signals and data signals wherein the scan signals are on or off in function of time and the data signals are updated in time, wherein off-to-on time of the scan signals, defined as the time where the scan signal changes from off to on state, and update time of the data signals are programmed in relation to the operation of the one or more cameras.

16. The active matrix display according to any one or a combination of 1-8 above, wherein off-to-on time of the scan signals and update time of the data signals are occurring out of the shutter opening time of the one or more cameras.

Certain terms are used throughout the description and claims to refer to particular methods, features, or components. As those having ordinary skill in the art will appreciate, different persons may refer to the same methods, features, or components by different names. This disclosure does not intend to distinguish between methods, features, or components that differ in name but not function. The figures are not necessarily drawn to scale. Certain features and components herein may be shown in exaggerated scale or in somewhat schematic form and some details of conventional elements may not be shown or described in interest of clarity and conciseness.

Although various example embodiments have been described in detail herein, those skilled in the art will readily appreciate in view of the present disclosure that many modifications are possible in the example embodiments without materially departing from the concepts of present disclosure. Accordingly, any such modifications are intended to be included in the scope of this disclosure. Likewise, while the disclosure herein contains many specifics, these specifics should not be construed as limiting the scope of the disclosure or of any of the appended claims, but merely as providing information pertinent to one or more specific embodiments that may fall within the scope of the disclosure and the appended claims. Any described features from the various embodiments disclosed may be employed in combination. In addition, other embodiments of the present disclosure may also be devised which lie within the scopes of the disclosure and the appended claims. Each addition, deletion, and modification to the embodiments that falls within the meaning and scope of the claims is to be embraced by the claims.

Certain embodiments and features may have been described using a set of numerical upper limits and a set of numerical lower limits. It should be appreciated that ranges including the combination of any two values, e.g., the combination of any lower value with any upper value, the combination of any two lower values, and/or the combination of any two upper values are contemplated unless otherwise indicated. Certain lower limits, upper limits and ranges may appear in one or more claims below. Any numerical value is "about" or "approximately" the indicated value, and takes into account experimental error and variations that would be expected by a person having ordinary skill in the art.

The invention claimed is:

1. An active matrix display comprising:
a plurality of pixel circuits, each of the plurality of pixel circuits comprising a light-emitting element, at least a first transistor, a second transistor, and a third transistor, and a storage capacitor,
wherein
the first transistor is a driving transistor configured to drive the light-emitting element, the first transistor having a gate connected to a first node,
the second transistor is a switching transistor having a first terminal connected to a data signal line, a second terminal connected to the first node, and a gate connected to a scan signal line,
the third transistor is a discharging transistor having a first terminal connected to the first node, a second terminal connected to ground, and a gate connected to a discharge signal line, and
the storage capacitor is connected between the first node and the ground,
wherein the third transistor is configured to discharge, wholly or at least in part, the storage capacitor, and
wherein
the second terminal of the second transistor is connected directly to the first node and/or
the first terminal of the third transistor is connected directly to the first node,
wherein each of the plurality of pixel circuits is connected to a respective one of one or more scan signal lines and a respective one of one or more data signal lines, which are configured to provide scan signals and data signals, respectively, and wherein each of the plurality of pixel circuits is further connected to a respective one of one or more discharge signal lines, which are each configured to provide a discharge signal, and
wherein the active matrix display further comprises at least two drive circuits, each of the at least two drive circuits having a scan signal set and per scan signal set having one of the one or more discharge signal lines.

2. The active matrix display according to claim 1, wherein the active matrix display is configured to display an image that is defined by scan signals and data signals, wherein the scan signals having a programmable start and stop.

3. The active matrix display according to claim 2, wherein the image displayed by the active matrix is recorded by one or more cameras each having a shutter and corresponding shutter opening time defined as the time when the shutter is open,
wherein the scan signals are on or off in function of time and the data signals are updated in time, and
wherein off-to-on time of the scan signals, defined as the time where the scan signal changes from off to on state, and update time of the data signals are programmed in relation to the operation of the one or more cameras.

4. The active matrix display according to claim 1, wherein each of the scan signal sets represents the scan signals for a different video data stream, and the image being displayed is video.

5. The active matrix display according to claim 1, wherein each of the scan signal sets represents the scan signals for a different video data stream, and the image being displayed is an active 3D video.

6. The active matrix display according to claim 1, wherein each of the scan signal sets represents the scan signals for a different video data stream, and the image being displayed is an active 3D video, and
wherein a lenticular lens array is placed on top of the light-emitting elements of the plurality of pixel circuits.

7. The active matrix according to claim 6, wherein a lenticular lens array is placed on top of the light-emitting elements of the plurality of pixel circuits comprising lenses with different viewing angle for each of the scan signal sets.

8. A method of displaying an image, the method comprising:
displaying the image using the active matrix display according to claim 1;
recording the displayed image by one or more cameras each having a shutter and corresponding shutter opening time defined as the time when the shutter is open;
wherein scan signals of the displayed image are on or off in function of time and data signals of the displayed image are updated in time, and
wherein off-to-on time of the scan signals, defined as the time where the scan signal changes from off to on state, and update time of the data signals are programmed in relation to the operation of the camera.

9. The active matrix display according to claim 1, wherein the first transistor has a first terminal connected to a voltage supply line and a second terminal connected to the light-emitting element.

10. The active matrix display according to claim 1, wherein the discharge signals are asserted at programmable timing to immediately cease light output of the light-emitting elements of each of the plurality of pixel circuits.

11. The active matrix display according to claim 1, wherein the second terminal of the second transistor is connected directly to the first node.

12. The active matrix display according to claim 1, wherein the first terminal of the third transistor is connected directly to the first node.

13. The active matrix display according to claim 1, wherein the second terminal of the second transistor is connected directly to the first node and the first terminal of the third transistor is connected directly to the first node.

14. An active matrix display comprising:
a plurality of pixel circuits, each of the plurality of pixel circuits comprising a light-emitting element, at least two transistors, and a storage capacitor,
wherein one of the at least two transistors is configured to discharge, wholly or at least in part, the storage capacitor,
wherein the active matrix display is configured to display an image that is defined by scan signals and data signals, wherein the scan signals having a programmable start and stop,
wherein the image displayed by the active matrix is recorded by one or more cameras each having a shutter and corresponding shutter opening time defined as the time when the shutter is open,
wherein the scan signals are on or off in function of time and the data signals are updated in time, and
wherein off-to-on time of the scan signals, defined as the time where the scan signal changes from off to on state, and update time of the data signals are programmed in relation to the operation of the one or more cameras.

15. The active matrix display according to claim 14, wherein the discharge signals are asserted at programmable timing to immediately cease light output of the light-emitting elements of each of the plurality of pixel circuits, and wherein the discharge signals are also asserted in relation to the operation of the one or more cameras, in particular in relation to their shutter opening time.

16. A method of displaying an image, the method comprising:
displaying the image using the active matrix display according to claim 4;
recording the displayed image by one or more cameras each having a shutter and corresponding shutter opening time defined as the time when the shutter is open;
wherein scan signals of the displayed image are on or off in function of time and data signals of the displayed image are updated in time, and
wherein off-to-on time of the scan signals, defined as the time where the scan signal changes from off to on state, and update time of the data signals are programmed in relation to the operation of the camera.

17. An active matrix display comprising:
a plurality of pixel circuits, each of the plurality of pixel circuits comprising a light-emitting element, at least two transistors, and a storage capacitor,
wherein one of the at least two transistors is configured to discharge, wholly or at least in part, the storage capacitor,
wherein each of the plurality of pixel circuits is connected to scan signal lines and data signal lines, which are configured to provide scan signals and data signals, respectively, and each of the plurality of pixel circuits is further connected to one or more discharge signal lines, which are each configured to provide a discharge signal, and
wherein the discharge signals are asserted at programmable timing to immediately cease light output of the light-emitting elements of each of the plurality of pixel circuits.

18. An active matrix display comprising:
a plurality of pixel circuits,
each of the plurality of pixel circuits comprising a light-emitting element, one or more transistors, and a storage capacitor, each of the plurality of pixel circuits having a first connection point and a second connection point, and being connected at their first connection point to first lines and at their second connection point to second lines; and
at least two drive circuits,
each of the drive circuits having electrical connections defined by rows and columns that electrically connect to the pixel circuits, each of the drive circuits being configured as a drive device;
wherein
each of the first lines is arranged to be connected to a data signal line of a data driver, connected to one of the columns of the corresponding drive circuit, and providing a data signal for driving one of the columns of the corresponding drive circuit;
each of the second lines is arranged to be connected to a scan signal line of a scanning unit, connected to one of the rows of the corresponding drive circuit, and providing a scan signal to one of the rows of the corresponding drive circuit;
the at least two drive circuits include a first drive circuit and a second drive circuit; and
at least one of the plurality of pixel circuits driven by the data signals of the first drive circuit is residing physically within the second drive circuit, or, at least one of the plurality of pixel circuits driven by the data signals of the second drive circuit is residing physically within the first drive circuit.

19. The active matrix display according to claim 18, displaying an image that is defined by scan signals and data signals, and comprising per drive circuit a scan signal set, wherein each of the scan signal sets has a programmable start and stop.

20. The active matrix display according to claim 19, wherein each of the scan signal sets represents the scan signals for a different video data stream, such that while having at least two drive circuits and thus at least two scan signal sets, there are at least two video data streams.

21. The active matrix display according to claim 19, wherein the image displayed by the active matrix display is recorded by one or more cameras each having a shutter and corresponding shutter opening time defined as the time when the shutter is open,
wherein the scan signals are on or off in function of time and the data signals are updated in time, and
wherein off-to-on time of the scan signals, defined as the time where the scan signal changes from off to on state, and update time of the data signals are programmed in relation to the operation of the camera.

22. The active matrix display according to claim 21, wherein off-to-on time of the scan signals and update time of the data signals are occurring out of the shutter opening time of the one or more cameras, when the shutter of the one or more cameras is closed.

23. An active matrix display displaying an image that is recorded by one or more cameras each having a shutter and corresponding shutter opening time defined as the time when the shutter is open, and the image being displayed is defined by scan signals and data signals,
wherein the scan signals are on or off in function of time and the data signals are updated in time, and
wherein off-to-on time of the scan signals, defined as the time where the scan signal changes from off to on state, and update time of the data signals are programmed in relation to the operation of the one or more cameras.

24. An active matrix display comprising:
a plurality of pixel circuits, each of the plurality of pixel circuits comprising a light-emitting element, at least a first transistor, a second transistor, and a third transistor, and a storage capacitor,
wherein
the first transistor is a driving transistor configured to drive the light-emitting element, the first transistor having a gate connected to a first node,
the second transistor is a switching transistor having a first terminal connected to a data signal line, a second terminal connected to the first node, and a gate connected to a scan signal line,
the third transistor is a discharging transistor having a first terminal connected to the first node, a second terminal connected to ground, and a gate connected to a discharge signal line, and
the storage capacitor is connected between the first node and the ground,
wherein the third transistor is configured to discharge, wholly or at least in part, the storage capacitor, and
wherein
the second terminal of the second transistor is connected directly to the first node and/or
the first terminal of the third transistor is connected directly to the first node,
wherein off-to-on time of scan signals of the scan signal line and update time of data signals of the data signal line occur out of a shutter opening time of one or more cameras.

25. The active matrix display according to claim 24, wherein the second terminal of the second transistor is connected directly to the first node.

26. The active matrix display according to claim 24, wherein the first terminal of the third transistor is connected directly to the first node.

* * * * *